(12) United States Patent
Poynter et al.

(10) Patent No.: US 12,229,041 B2
(45) Date of Patent: Feb. 18, 2025

(54) TOOL FOR MOBILE APP DEVELOPMENT AND TESTING USING A PHYSICAL MOBILE DEVICE

(71) Applicant: Sphere Entertainment Group, LLC, New York, NY (US)

(72) Inventors: Benjamin Poynter, New York, NY (US); David E. Rodriguez, Harrison, NJ (US)

(73) Assignee: Sphere Entertainment Group, LLC, New York, NY (US)

( * ) Notice: Subject to any disclaimer, the term of this patent is extended or adjusted under 35 U.S.C. 154(b) by 0 days.

(21) Appl. No.: 17/314,193

(22) Filed: May 7, 2021

(65) Prior Publication Data

US 2022/0358027 A1 Nov. 10, 2022

(51) Int. Cl.
| | |
|---|---|
| *G06F 11/36* | (2006.01) |
| *G06F 3/01* | (2006.01) |
| *G06T 7/11* | (2017.01) |
| *G06T 15/20* | (2011.01) |
| *H04W 88/02* | (2009.01) |

(52) U.S. Cl.
CPC .......... *G06F 11/3664* (2013.01); *G06F 3/011* (2013.01); *G06F 11/3688* (2013.01); *G06T 7/11* (2017.01); *G06T 15/20* (2013.01); *G06T 2207/10016* (2013.01); *G06T 2207/20132* (2013.01); *H04W 88/02* (2013.01)

(58) Field of Classification Search
CPC .. G06F 11/3664; G06F 11/3668; G06F 3/011; G06T 7/11; G06T 15/20; G06T 2207/10016; G06T 2207/20132; H04W 88/02
See application file for complete search history.

(56) References Cited

U.S. PATENT DOCUMENTS

| | | | |
|---|---|---|---|
| 9,412,000 B1 * | 8/2016 | Ge | ........................ G01S 5/0289 |
| 9,449,433 B2 | 9/2016 | Fong | |
| 9,645,910 B1 * | 5/2017 | Kaila | .................. G06F 11/3624 |
| 10,210,382 B2 | 2/2019 | Shotton et al. | |

(Continued)

OTHER PUBLICATIONS

Purzel, Franziska, et al. "Applications of a Modular Interaction Framework for Virtual Reality Testing in a Smart Environment." Procedia CIRP 9 (2013): 35-39. (Year: 2013).*

(Continued)

*Primary Examiner* — Kevin L Young
*Assistant Examiner* — Joanne G Macasiano
(74) *Attorney, Agent, or Firm* — Sterne, Kessler, Goldstein & Fox P.L.L.C.

(57) ABSTRACT

Disclosed herein are system, method, and computer program product embodiments for generating a Virtual Reality (VR) simulation. By combining physical and simulated data from a physical, virtual mobile device and virtual environment and rendering that within a VR simulation, the system can give the developer a more hands-on accurate representation and feel for how their mobile app can work at a real-world environment. This VR simulation assists a developer to cut down on iteration and travel time when developing, debugging, and testing their mobile apps/games for real-world environments, location-based entertainment (LBE) venues including indoor or outdoor installations.

21 Claims, 25 Drawing Sheets

(56) References Cited

U.S. PATENT DOCUMENTS

| | | | | |
|---|---|---|---|---|
| 11,003,812 | B2* | 5/2021 | Shalev | G06T 19/006 |
| 11,086,392 | B1* | 8/2021 | Sztuk | G06F 3/1423 |
| 11,250,617 | B1* | 2/2022 | Sempe | H04L 65/611 |
| 2014/0375752 | A1* | 12/2014 | Shoemake | G06V 40/10 |
| | | | | 348/14.07 |
| 2015/0348322 | A1 | 12/2015 | Ligameri et al. | |
| 2017/0249726 | A1* | 8/2017 | Rochford | G06F 1/163 |
| 2018/0150387 | A1* | 5/2018 | Kogan | G06F 8/38 |
| 2018/0267496 | A1* | 9/2018 | Wang | G05B 19/056 |
| 2018/0365883 | A1* | 12/2018 | Fillhardt | G06F 3/011 |
| 2019/0196940 | A1* | 6/2019 | Psiaki | G06F 11/3664 |
| 2019/0333288 | A1 | 10/2019 | Smet et al. | |
| 2019/0361797 | A1 | 11/2019 | Yerli | |
| 2021/0311844 | A1 | 10/2021 | Daniali | |
| 2022/0133212 | A1 | 5/2022 | Krueger | |
| 2022/0295223 | A1 | 9/2022 | Palos et al. | |
| 2022/0358736 | A1 | 11/2022 | Poynter et al. | |

OTHER PUBLICATIONS

Amano, Tatsuya, et al. "Smartphone applications testbed using virtual reality." Proceedings of the 15th EAI International Conference on Mobile and Ubiquitous Systems: Computing, Networking and Services. 2018. (Year: 2018).*

Terrier, Romain, et al. "Evaluation of ar inconsistencies on ar placement tasks: A vr simulation study." Virtual Reality and Augmented Reality: 15th EuroVR International Conference, EuroVR 2018, London, UK, Oct. 22-23, 2018, Proceedings 15. Springer International Publishing, 2018. (Year: 2018).*

Prince, Simon, et al. "3d live: Real time captured content for mixed reality." Proceedings. International Symposium on Mixed and Augmented Reality. IEEE, 2002. (Year: 2002).*

Savino, Gian-Luca. "Virtual Smartphone: High Fidelity Interaction with Proxy Objects in Virtual Reality." arXiv preprint arXiv: 2010.00942 (2020). (Year: 2020).*

Diewald, Stefan. Implementation of a Development Toolchain for the Simulation of Mobile Devices using the ROS Middleware. Diss. PhD thesis. Jan. 2011. (Year: 2011).*

Zhang, Li, et al. "Is this my phone? operating a physical smartphone in virtual reality." SIGGRAPH Asia 2020 XR. 2020.1-2. (Year: 2020).

CooleoBrad, "How to Use Your Phone or Tablet in VR! | iOS and Android," accessed at https://www.youtube.com/watch?v= QhfZjbVUxZE, YouTube video published on Dec. 20, 2017; 4 minutes.

Tyriel Wood—VR Tech, "How to Bring Your Phone in VR," accessed at https://www.youtube.com/watch?v=hvzgeQaZgBM, YouTube video published on Sep. 1, 2020; 11 minutes 26 seconds.

* cited by examiner

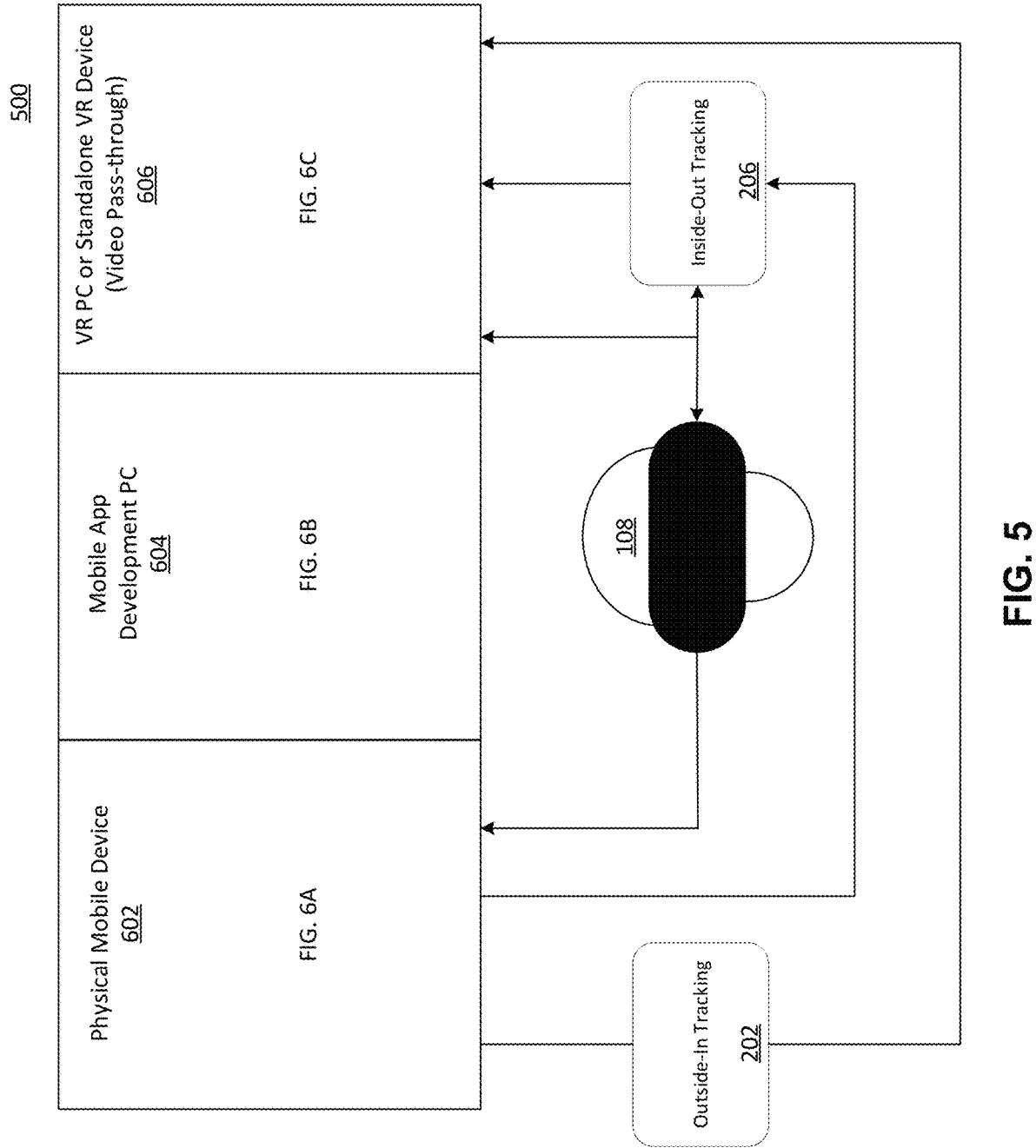

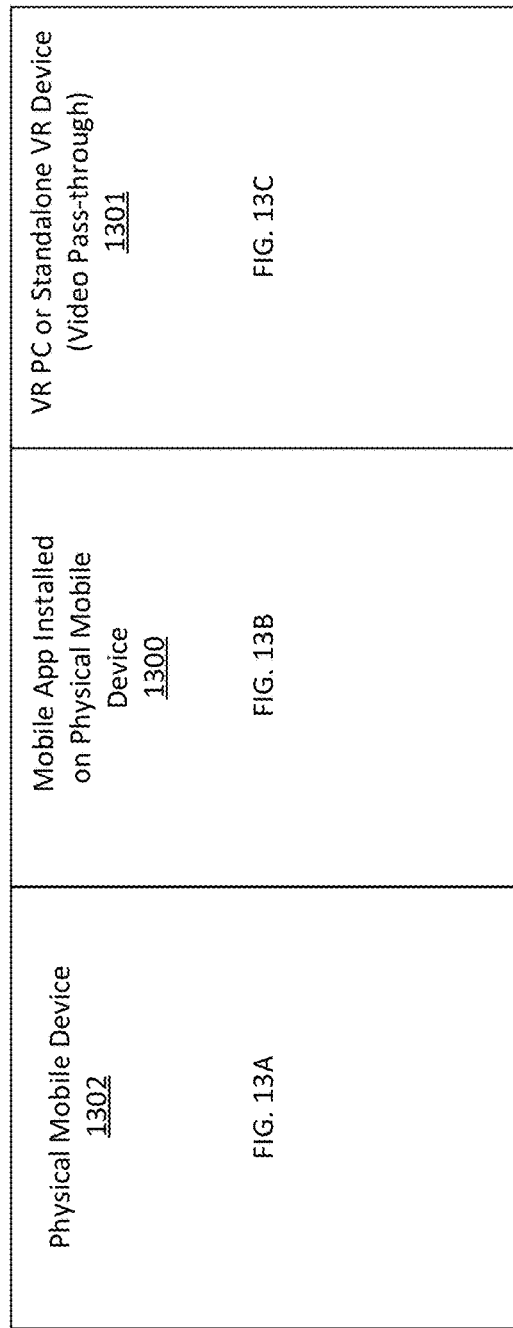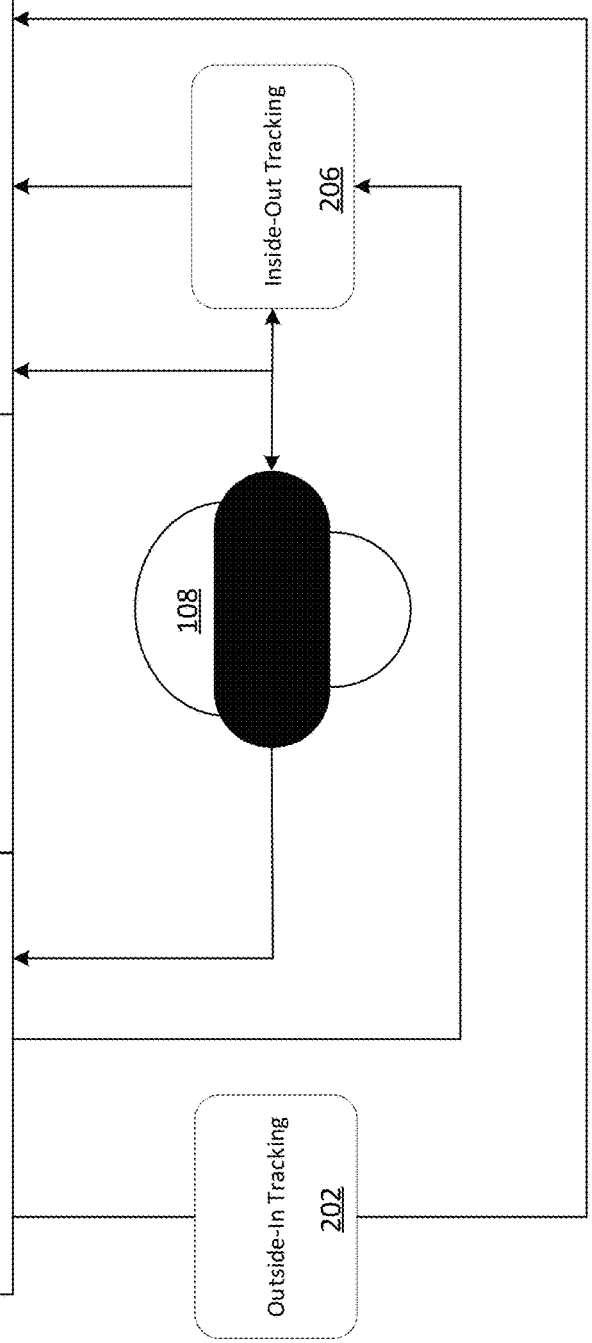
FIG. 12

TOOL FOR MOBILE APP DEVELOPMENT AND TESTING USING A PHYSICAL MOBILE DEVICE

BACKGROUND OF THE DISCLOSURE

When developing, designing, or conceiving real-world environment-based mobile applications (apps), it can be cumbersome and inefficient for a developer to visit a real-world environment each time they would like to test their mobile app (application) accurately within that environment. Also, it can be difficult to visualize and play prototypes of the app without physically being at the real-world environment.

For example, if a developer is creating a mobile game that interacts with a large amusement park ride, it can be difficult to test the game efficiently with enough iterations (tests). The developer would have to travel to the real-world amusement park/venue to test every new build of their game. This travel can be a challenge, especially when developers are working from remote locations.

BRIEF DESCRIPTION OF THE DRAWINGS/FIGURES

The accompanying drawings, which are included to provide a further understanding of the disclosure and are incorporated in and constitute a part of this specification, illustrate exemplary embodiments. In the drawings:

FIG. 5 illustrates a system workflow for a virtual mobile device visualization within a virtual reality (VR) simulation, according to some embodiments.

FIG. 12 illustrates a system workflow for a virtual mobile device visualization within a virtual reality (VR) simulation, according to some embodiments.

The present disclosure will now be described with reference to the accompanying drawings. In the drawings, like reference numbers may indicate identical or functionally similar elements.

DETAILED DESCRIPTION OF THE DISCLOSURE

Figure 1:
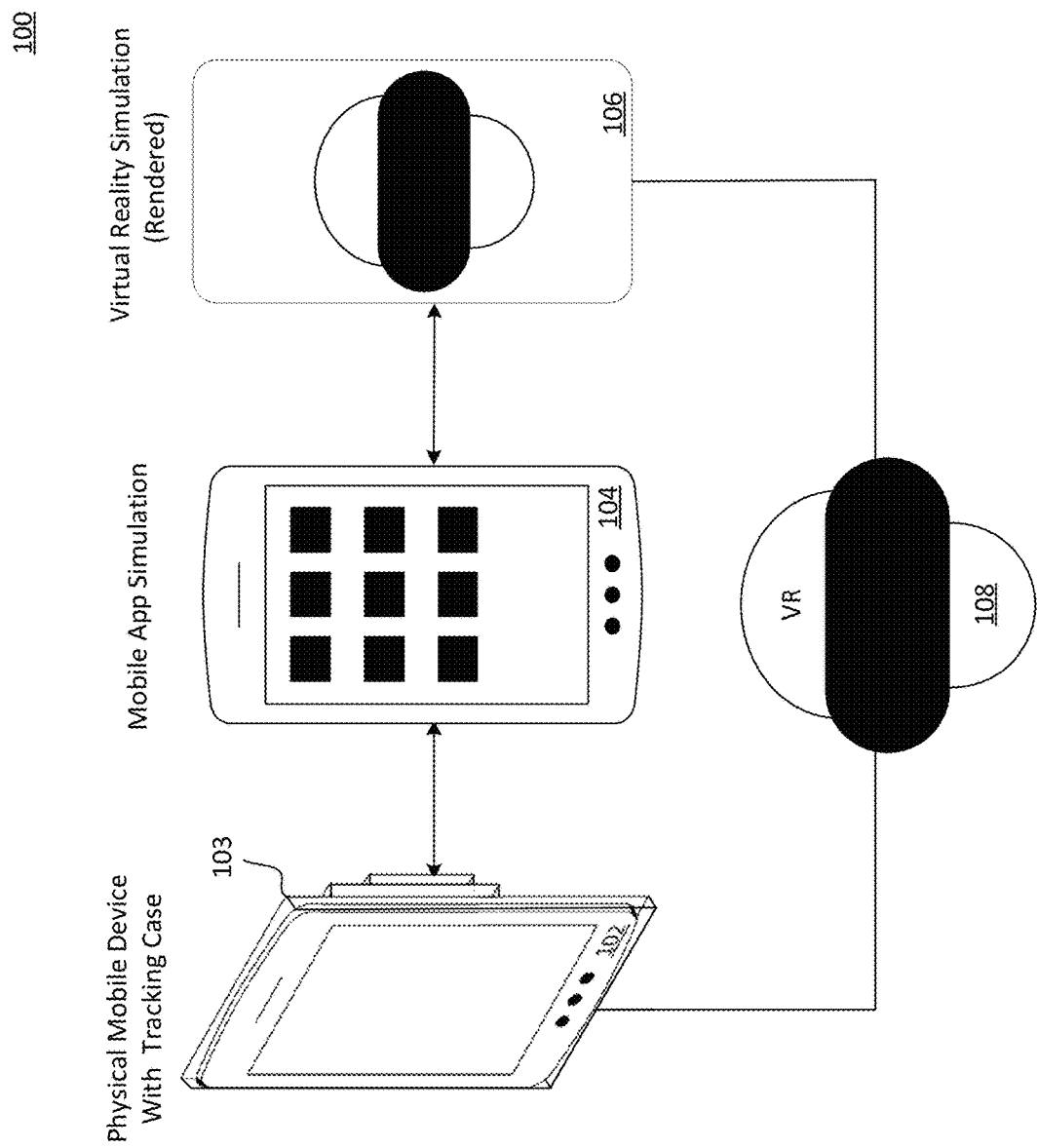
FIG. 1 illustrates system for a virtual mobile device visualization within a virtual reality (VR) simulation, according to some embodiments.

Provided herein are system, apparatus, device, method and/or computer program product embodiments, and/or combinations and sub-combinations thereof, for mobile app development and testing using a physical mobile device.

The detailed description to follow is to describe various embodiments providing an environment to test a mobile application (app) that can be, for example, currently in development. A conventional test environment may include a personal computer (PC) with application coding software, game engine, testing libraries, compilers, renderers, etc. However, a unique challenge exists for the conventional testing of mobile apps that function by interacting with a real-world environment. Conventionally, these mobile apps require a tester to travel to the real-world environment to properly test any elements that directly interact with that location. The detailed description to follow is to replicate the real-world test environment as closely as possible such that the tester is no longer required to travel to the real-world environment to test any elements of their app that directly interact with that location.

In one example, a venue represents a real-world environment for hosting an event. The venue can represent a music venue, such as a music theater, a music club, and/or a concert hall, a sporting venue, such as an arena, a convention center, and/or a stadium, and/or any other suitable venue. The event can represent a musical event, a theatrical event, a sporting event, a motion picture, and/or any other suitable event that may present interactive content to members of an audience within the venue.

Conventionally, while developing an audience interactive app for an audience member's smartphone, a developer would compile a latest version of their app and download it to their smartphone. The developer, or a tester, would then conventionally travel to the venue to test the latest version of their app, for example, any recent upgrades or new features. However, travel is expensive, time consuming and not always useful, as the venue may not be fully operational (e.g., under construction).

In the various embodiments, a simulation of the real-world environment may be used in the test environment as a substitute for the tester being on-location, namely, physically present at the real-world environment. In these embodiments, imagery from the real-world environment may be collected by video, pictures, LIDAR scans, pre-recorded imagery, sculpted 3D virtual environments, etc. This imagery is then used to generate a simulation of the real-world environment that can then be rendered on a stand-alone computer or on a virtual reality (VR) headset.

In some embodiments, during testing, the tester holds a smartphone in their hands while wearing a VR headset. The simulation of the real-world environment is fed as imagery to the VR headset. This simulation may be generated through a game engine editor or standalone system which feeds simulated visuals into VR headset. A wearer of the VR headset would be able to look around the venue as if they were there in person.

If one were actually at the venue playing an interactive app on their mobile device (smartphone), they would also see the smartphone itself and their hands/fingers as they interacted with the smartphone. Therefore, in various embodiments, a visualization of the smartphone is simulated and overlaid on the simulation of the real-world environment (venue). Hands and finger movements can also be simulated and overlaid on the simulation of the real-world environment (venue).

Also, if one were actually at the venue playing an interactive app on their mobile device (smartphone), they would also see the smartphone move relative to the venue as they moved the smartphone in different directions or pointed it at a specific item of interest in the venue. Therefore, in various embodiments, a location of the smartphone relative to the VR headset is determined and then simulated as a virtual point of origin within the simulation of the real-world environment (venue).

In addition, if one were actually at the venue playing an interactive app on their mobile device (smartphone), they would also physically interact with the smartphone (e.g., touch, vibration, audio, video, etc.). Therefore, in various embodiments, physical interactions the tester has with the smartphone they are holding are recorded (e.g., touch recognition) and simulated on the visualization of the smartphone in the VR headset. In addition, these inputs are being captured on both mobile device and the mobile simulation.

Mobile app signals directed to the phone (e.g., audio, video, and vibrations) may also be simulated and communicated to the smartphone, such that the tester actually feels, for example, haptic feedback. Sending these signals to the smartphone gives the tester a "real-world" feel as they would if they were physically using the app at the venue.

In various embodiments described herein, the technology described herein can allow a developer to cut down on iteration and travel time when developing, debugging, and/or testing their mobile applications (apps) at real-world environments, like location-based entertainment (LBE) venues including indoor or outdoor installations, within a Virtual Reality (VR) environment. By combining physical and/or simulated data from a physical and virtual mobile device and rendering the physical and/or the simulated data within a VR simulation, the various embodiments described herein can provide the developer a hands-on accurate representation and feel for how their mobile app will work at a real-world environment. For example, the developer can test their location based mobile apps, for example, dual screen mobile apps, mobile games, and mobile augmented/mixed reality apps to provide some examples, using a physical mobile device within a VR simulation.

The technology described herein in various embodiments can run in real-time, or near-real time, and can include a mobile device case (tracking case) that attaches to a physical mobile device in the real world to allow for precise inside-out or outside-in tracking of its physical location coordinates and screen boundary coordinates relative to a virtual origin within a VR simulation.

In some embodiments, the system combines simulated and physical input, camera, microphone, sensor, display, and audio data between a VR simulation, a remote app running on a physical mobile device, and a mobile app simulation running and being developed on a mobile app development PC. In some embodiments, the system transmits and combines simulated and physical input, camera, microphone, sensor, display, and audio data between a VR simulation and a mobile app running on a physical mobile device without the use of a mobile app development PC.

In some embodiments, a virtual mobile device visualization within the VR simulation combines physical and simulated inputs, such as, but not limited to, camera, microphone, sensor, display, and audio data from the VR simulation. The remote app or mobile app runs on a physical mobile device or optionally a mobile app simulation running and being developed on a mobile app development PC. In addition, the system uses tracked mobile device case screen boundary coordinates to provide a video pass-through visualization of the physical mobile device screen by cropping a video feed from the VR headset based on calculated screen boundary coordinates.

These various tools, which to be described in further detail below, represent one or more electronic software tools, that when executed by one or more computing devices, processors, controllers, or other devices that will be apparent to those skilled in the relevant art(s) without departing from the spirit and scope of the present disclosure, can analyze, process, and/or translate audio, video and movement and/or their corresponding digital commands.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

FIG. 1 illustrates a system 100 for a virtual mobile device visualization within a virtual reality (VR) simulation, according to some embodiments. System 100 includes physical mobile device 102 (e.g., smartphone, tablet, wearable computer, etc.) representing a real-world input/output system that may interact in a virtual reality (VR) or augmented reality (AR) environment. This physical mobile device (mobile device) 102, in various embodiments, includes a mobile device tracking module (such as case 103) to establish a position (e.g., location in six degrees of movement) of the mobile device 102 relative to a proximate (near) Virtual Reality (VR) headset 108. The mobile device tracking module can be a case with passive elements, such as markings, an active case with electronic location elements or alternatively be built-in to the smartphone itself.

VR is a simulated experience that can be similar to the real world. Applications of virtual reality include entertainment (e.g. video games), education (e.g. medical or military training) and business (e.g. virtual meetings). Other distinct types of VR-style technology include augmented reality and mixed reality, sometimes referred to as extended reality or XR.

Currently, standard virtual reality systems use either virtual reality headsets or multi-projected environments to generate realistic images, sounds and other sensations that simulate a user's physical presence in a virtual environment. A person using virtual reality equipment is able to look around the virtual environment, move around in it, and interact with virtual features or items. The effect is commonly created by VR headsets consisting of a head-mounted display with a small screen in front of the eyes, but can also be created through specially designed rooms with multiple large screens. Virtual reality typically incorporates auditory and video feedback, but may also allow other types of sensory and force feedback through haptic technology.

When developing a new VR application, or updating an existing VR application, especially for large scale environments, travelling to a subject location to test the application as it is being developed may not be convenient or possible. Therefore, in various embodiments described herein, a virtual mobile device visualization within a VR simulation 106 combines physical and simulated inputs from the physical mobile device, such as, but not limited to, camera, microphone, sensor, display, and audio data (e.g., mobile device actions performed during testing). A remote app runs on a physical mobile device 102 collecting the physical inputs and communicates this data to a mobile app simulation 104 running on a mobile app development PC. This mobile app simulation may allow a mobile app under development to run on a standalone computer without repeated compiling and loading of the mobile app to the physical mobile device each time a change is made to the mobile app. In this way, the developer can continuously update or upgrade the code of the mobile app and test using the mobile device, but without requiring execution on the mobile device. The mobile simulation can also communicate data and configuration information to both the physical mobile device as well as the VR simulation. Each of these elements will be described in greater detail hereafter.

Figure 2:
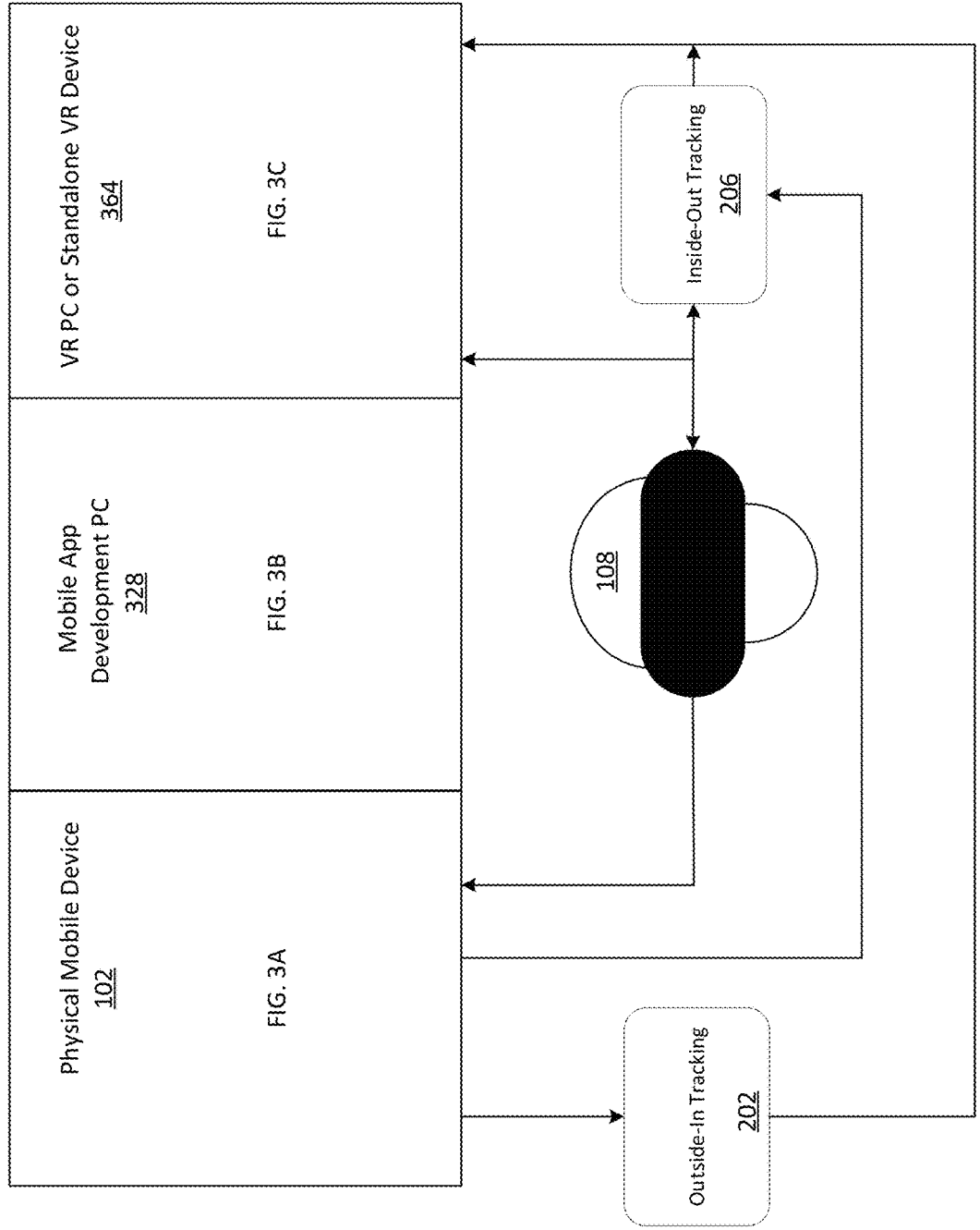
FIG. 2 illustrates a system workflow for a virtual mobile device visualization within a virtual reality (VR) simulation, according to some embodiments.

FIG. 2 illustrates a system workflow 200 for a virtual mobile device visualization within a virtual reality (VR) simulation, according to some embodiments. Physical mobile device 102 may execute a remote app with corresponding process flows as described in greater detail in FIG. 3A. Mobile app development PC 328 or equivalent may implement a mobile app simulation 104 with corresponding process flows detailed hereafter in association with FIG. 3B.

Figure 3A:
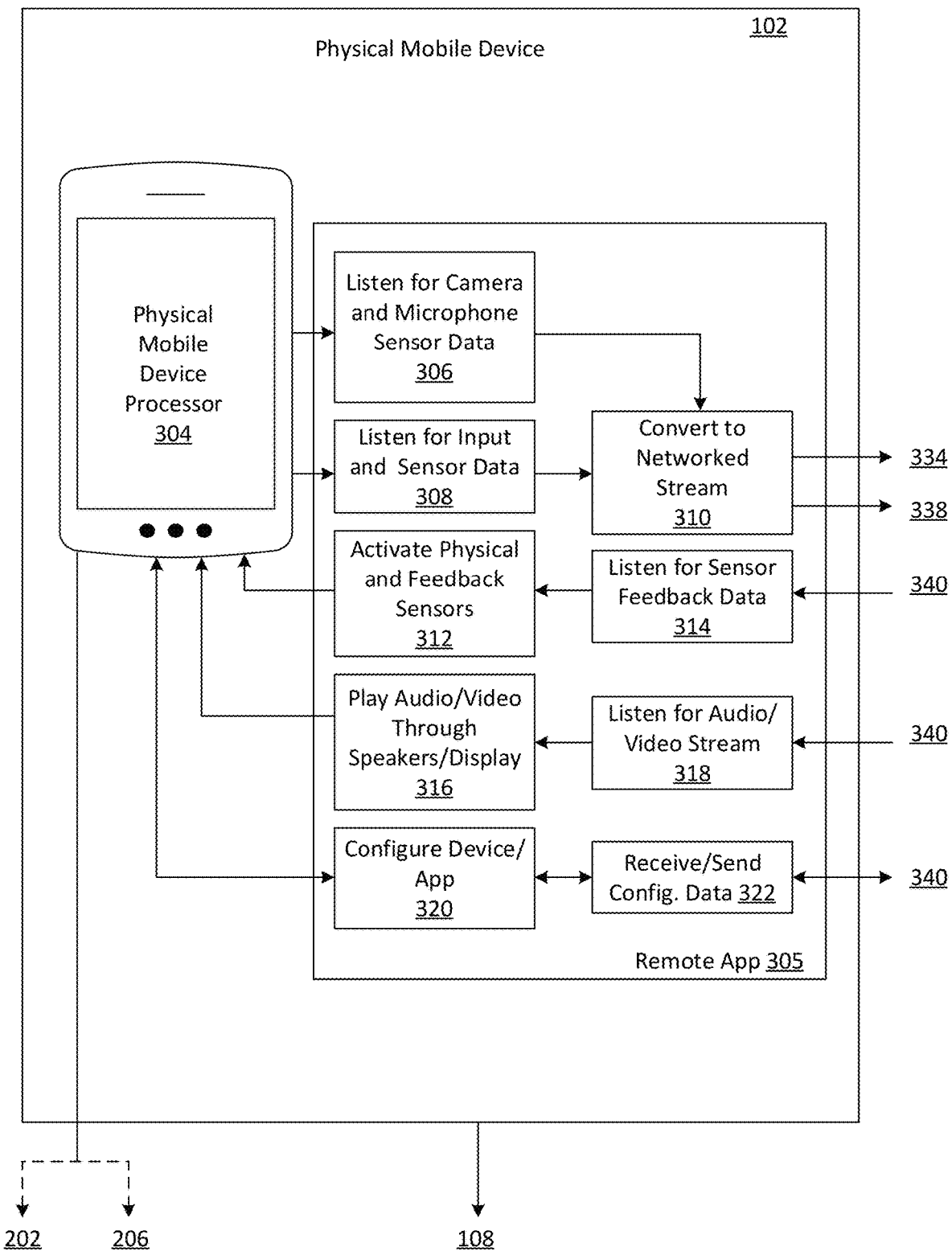
FIG. 3A illustrates a physical mobile device with mobile device case, according to some embodiments.
Figure 3B:
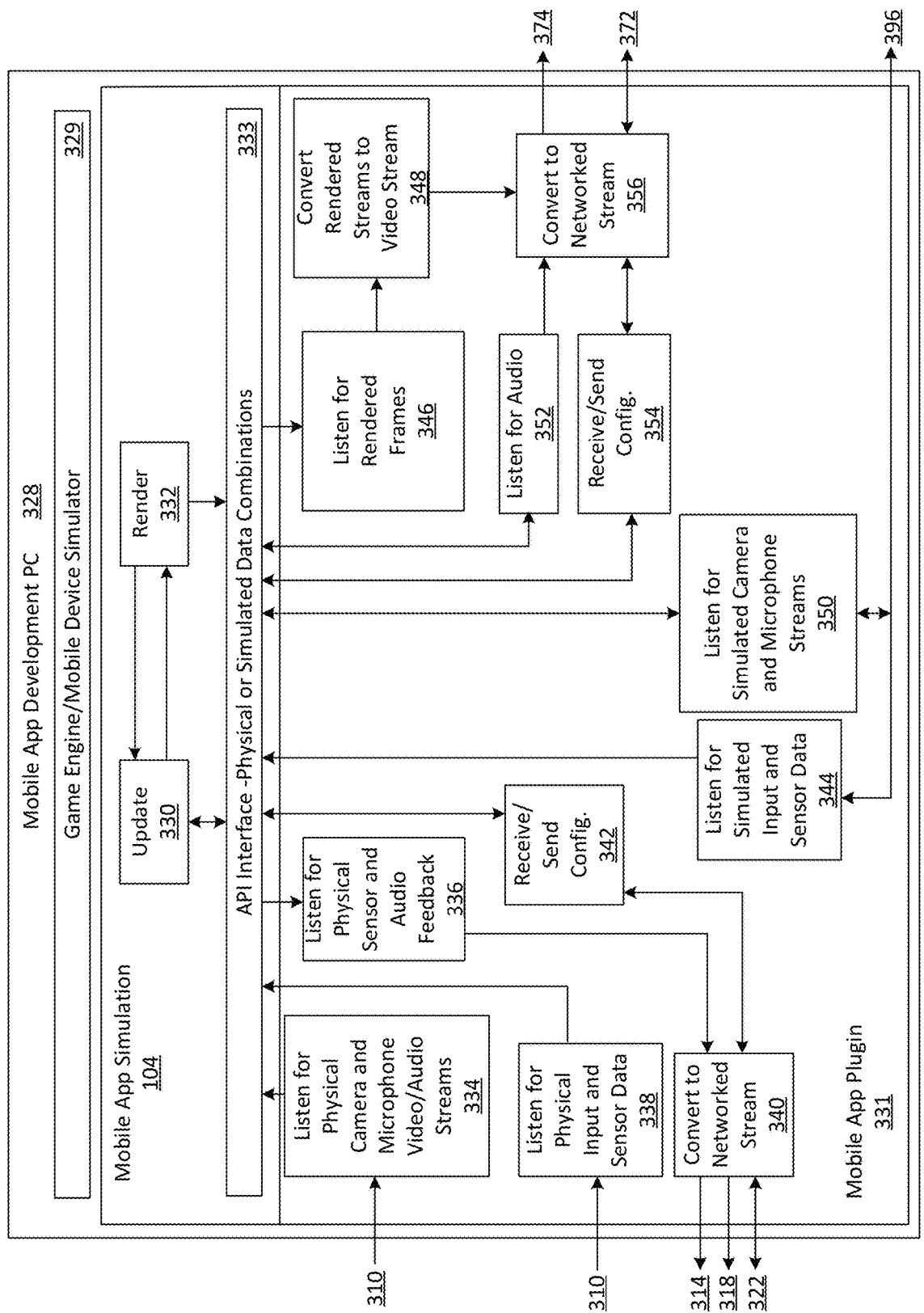
FIG. 3B illustrates a mobile app simulation, according to some embodiments.
Figure 3C:
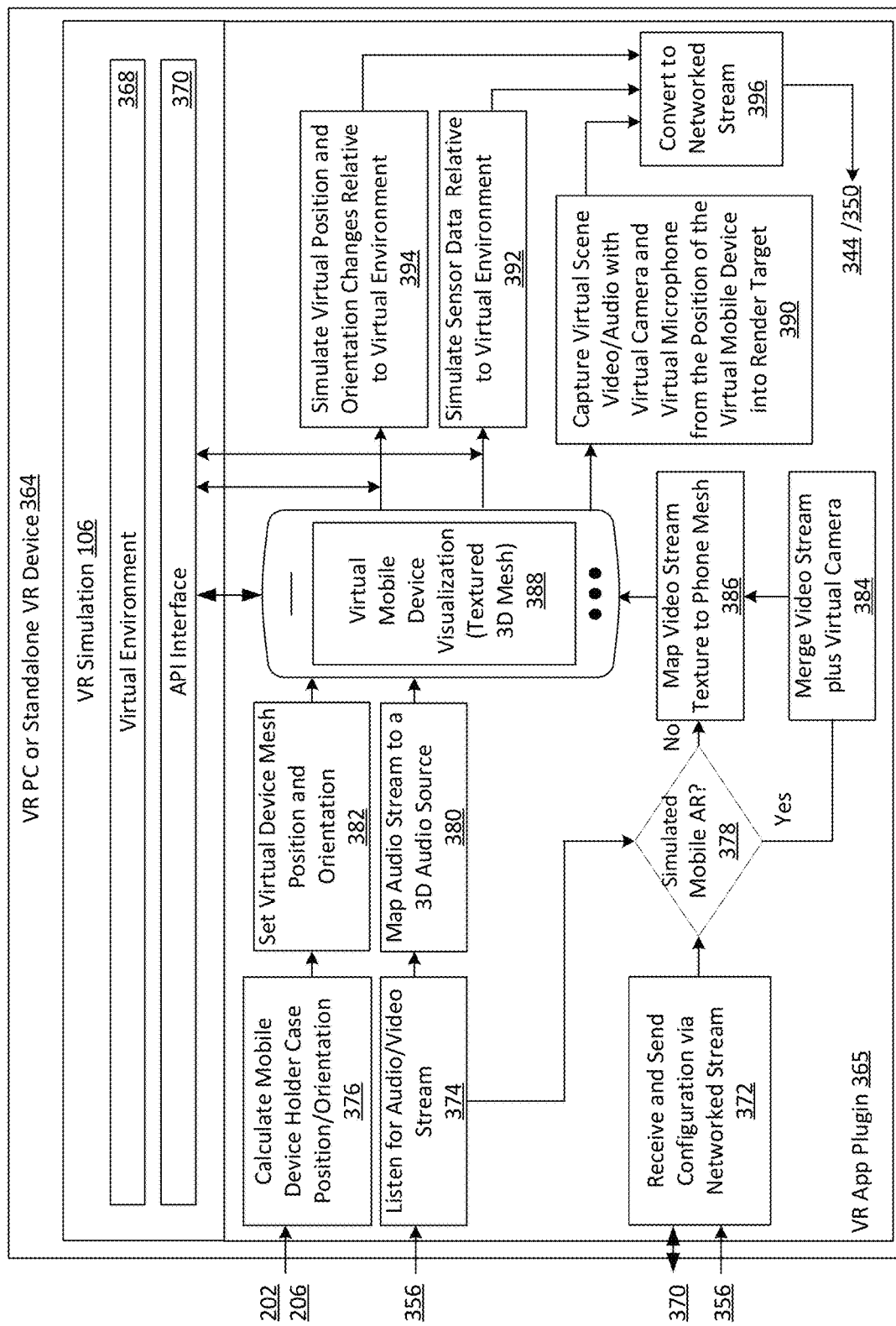
FIG. 3C illustrates a VR simulation with rendered virtual mobile device visualization, according to some embodiments.

A VR PC or standalone VR device 364 provides a VR simulation 106 to test the mobile application as detailed hereafter in association with FIG. 3C.

In various embodiments, trackers using, for example, Outside-In tracking 202 and Inside-Out tracking 206 methods are configured to track a physical mobile device 102 screen bounding rectangle (perimeter of display) for captured video within VR headset 108. To visualize the physical mobile device as an overlay on the virtual environment, the mobile device's location and orientation relative to the VR headset is tracked. In some embodiments, the display screen perimeter (bounding rectangle) can be tracked to render a cropped VR headset captured video.

Outside-In tracking 202 makes use of external cameras located near (e.g., the same room) the VR headset 108. For example, the external cameras are on tripods and pointed toward the user with a VR headset on holding the physical mobile device. These external cameras implement tracking of a physical mobile device case 103 relative to the position of the VR headset 108. In some embodiments, the tracking case 103 is securely attached to the physical mobile device and includes various tracking elements, such as GPS, gyroscopes, accelerometers, magnetometers, structured light systems, identifiable markings around a perimeter of the case, etc.

Screen boundary coordinates are tracked with Outside-In tracking 202. Since a location of the tracking case relative to the physical edges of the mobile device case 103 is known, a pre-determined measured look-up table of relative distances from the edges of each physical mobile device case (e.g., known dimensions of cases to smartphone dimensions including screen size) with respect to the location and orientation of the tracker is created. This provides a calculated location of the mobile device case's bounding rectangle that can be used within the VR Simulation.

Inside-Out tracking 206 makes use of onboard cameras on a VR headset 108 to track objects using machine vision techniques, without the use of external base stations or external cameras. VR headsets support inside-out tracking for the headset position. These headsets track active lights on VR controllers and use machine vision techniques to track the motion of the lights/markers, then since they know the exact position of those markers (e.g., four corners of a VR controller), they can calculate the orientation and position of the VR controllers. This similar technique can be used for inside-out tracking 206 of a custom-built mobile device tracking module, as will be discussed in further detail hereafter.

In one embodiment, active tracking cases, may include lights (visible or infrared) that surround the mobile device case powered by the physical mobile device 102 or batteries. The lights can have various positions around the mobile device case 103. These lights allow the VR headset 108 to track the position of the mobile phone in space by triangulating between three or more known light positions on the case and by knowing the dimensions of the mobile device case 103. With this information, an approximate 3D location of the phone in space relative to the VR headset 108 camera position is calculated.

In some embodiments, the case has high contrast fiducial markers (i.e., printed designs and patterns, bright colors, or markings around the edge of the mobile device case so that it is clearly visible in a camera) that can be used with machine vision to track those fiducial markers. There already exist multiple machine vision libraries with the capabilities to track objects based on colors or patterns. The fiducial markers can have various positions around the case and various designs. These fiducial markers allow the VR headset to track the position of the mobile phone in space by triangulating between 3 or more known marker positions on the case and by knowing the dimensions of the phone case. With this information the system can approximate the 3D location and orientation of the mobile device case in space relative to the VR headset camera position.

In one embodiment, a user's hands are visualized within VR headset 108 by making use of a 3D model of hands or finger tracking to locate where on the screen they are touching and moving to match touch poses. These hand/finger tracking methods can be used with both Outside-In and Inside-Out tracking.

FIGS. 3A-3C collectively illustrate an operational flow for a virtual mobile device visualization within a virtual reality (VR) simulation, according to some embodiments. An overall system architecture may include, in FIG. 3A, a physical mobile device (102) with computer processor 304 running a remote app 305, in FIG. 3B, a mobile app development PC 328 running a mobile app simulation 104 and, in FIG. 3C, a VR PC or standalone VR device 364 rendering a virtual mobile device visualization 388 in a VR simulation 106. System 200 provides support for transmitting and combining simulated and physical inputs, camera, microphone, sensor, display, and audio data between remote app 305 running on a physical mobile device 102, and a mobile app simulation 104 running and being developed on a mobile app development PC 328 and a VR simulation 106. The VR environment simulation 368 virtually recreates the context and physical real-world environments/LBE venues/outdoor or indoor installations where the mobile app will be used.

FIG. 3A illustrates a physical mobile device, according to some embodiments. As previously described in FIG. 1, a mobile device case 103 (not shown) attaches to physical mobile device 102 in the real world to communicate with outside-in tracking 202 or inside-out tracking 206 tracking of its physical location coordinates and screen boundary coordinates relative to a virtual origin within a VR simulation.

Physical mobile device 102 is, for example, a smartphone. The mobile device can be inserted (secure attachment) into a tracking case 103 that is configured to track the mobile device's position relative to a location of the tracking case within the VR simulation.

Physical mobile device 102 may have a remote app 305 installed and executed by computer processor 304. This remote app is configured to listen and control various physical mobile device data points. For example, the remote app may listen for camera and microphone sensor data 306 and physical inputs and sensor data 308. Detected data are converted to a network stream 310 and communicated to the mobile app simulation 104 (FIG. 3B—334 and 338). In another example, the remote app 305 may turn on/off lights or camera flash/flashlight, etc.

In addition, the remote app may activate/control the physical mobile device's feedback sensors based on sensor feedback data from the mobile app simulation 104 (FIG. 3B—340). Sensor activation may include, but is not limited to, physical and feedback sensors 312 such as haptics and vibrations based on listening for sensor feedback data 314. Some examples of input data are touch and drag events, touch gesture events (i.e., swipe left/up/down/right, double taps, other swipes and gesture patterns, etc.), and motion gesture events (i.e., shake the mobile device, shake left, shake right, orient the device in portrait or landscape, etc.). Some examples of sensor data are GPS events, accelerometer events, gyroscope events, LIDAR sensor data (front and back LIDAR cameras for scanning, face tracking, AR, etc.), Camera/LIDAR AR anchor, plane, feature points, and ambient light sensors. This is useful for the mobile app simulation to make use of all the physical mobile device feedback mechanisms for a user that is holding the physical mobile device to feel in real-time.

In addition, audio/video streams can be activated 316. For example, audio can be played through the physical speakers based on listening for an audio stream 316. The remote app 305 may play audio through the physical device speakers based on simulated audio streams it receives from the mobile app simulation. This may allow the mobile app simulation to play audio directly through the physical mobile device so that the user can hear it in the real world. Video/imagery may be displayed on the physical display/screen based on listening for video/imagery 316.

The remote app 305 may turn on/off the mobile device camera, microphone, input, sensors, and feedback sensors based on a configuration 322 received from the mobile app simulation 104 (FIG. 3B—340) and VR simulation 106 (FIG. 3C). In this way, the remote app 305 can enable/disable features by configuring the device/app 320 needed for the current mobile app simulation being developed. For example, the remote app 305 may use camera (front and back cameras) video and microphone audio sensor data and convert that to a networked stream to send to the mobile app simulation.

Similarly, the remote app 305 may send configuration data to the mobile app simulation 104 and VR simulation 106 (through FIG. 3C—372). For example, the remote app can identify which phone form factor or specifications it is running on and transmit that configuration data back to the VR simulation 106 so that the virtual mobile device visualization 388 can choose the appropriate mesh and screen dimensions/resolution to display within the VR simulation.

FIG. 3B illustrates a mobile app simulation, according to some embodiments. In the previously described process flow of FIG. 3A, inputs, camera, microphone, sensor data, and configurations are converted into a networked data stream to be transmitted and received between the remote app, mobile app simulation, and VR simulation, and other parts of system 200.

In one embodiment, networked data streams between the remote app, mobile app simulation, and VR simulation may be implemented using a networking library that makes use of an underlying network transport protocol, such as User Datagram Protocol (UDP) or Transmission Control Protocol (TCP), and using a known application protocols (networking protocols) for custom data transfer and using known streaming networking protocols for video/audio streaming. These known application protocols typically contain libraries allowing a variety of data types to encode and decode the data at each device or computer and make use of the data or corresponding video/audio streams.

This networked communication can happen locally, such as peer-to-peer between devices or through a centralized server that can communicate with all the devices on the system either wired (i.e., using Ethernet or Universal Serial Bus (USB)) or wirelessly (i.e., using WiFi, Bluetooth or mobile communications standards).

If the mobile app simulation 104 and the VR simulation 106 (FIG. 3C) are running on a common computer, they can also make use of faster local Graphics Processing Unit (GPU) frame buffer sharing protocols. These sharing protocols allow the running applications to share frame buffers thereby bypassing the network and allowing for faster updates and higher framerates.

In one embodiment, mobile app simulation 104 is executed inside of a game engine/mobile device simulator 329 on the mobile app development PC. Functionality typically provided by a game engine may include a rendering engine ("renderer") for 2D or 3D graphics, a physics engine or collision detection (and collision response), sound, scripting, animation, artificial intelligence, networking, streaming, memory management, threading, localization support, scene graph, and video support for cinematics.

The mobile app simulation 104 is a simulation of the custom application that the developer is creating, testing, debugging, etc. This mobile app simulation can be eventually be developed into a mobile app that can deployed onto a mobile device for testing on physical hardware, but with the technology tools described herein, the system may test the app on physical mobile device hardware while it's running on the mobile app development pc. This can allow for faster iteration times by allowing the developer to make changes and fixes to the mobile app simulation in real-time without needing to continuously compile and redeploy the mobile app on the mobile device.

The mobile app simulation 104 can include an update/render loop. The update process 330 updates the mobile app simulation 104 state by taking in input data from various sources, programmatically changing the application state, and programmatically communicating and updating external data sinks (e.g., persistent inputs/outputs on a smartphone that has a link to the mobile app simulation). Input data, in another example, include usage of the mobile device's camera or microphone functions.

In the above example, the mobile app simulation 104 communicates through API interface 333 to mobile app plugin 331. The mobile app plugin 331 communicates directly with mobile app simulation 104 through its update/render loop to provide data and receive data for modifying the application state and receives the rendered graphics and audio content. The mobile app simulation 104 communicates through the API interface to access the various subsystems of the mobile app plugin 331.

After the update process 330 has updated the state of the application, the render process 332 can take the application state and draw/update 2D and 3D graphics buffers and update audio buffers to prepare for displaying on-screen and outputting to the audio system. In various embodiments, there can be more than one update and render process and some may run in parallel in different mobile app systems. For example, the update/render loop in a game engine, is different than that of an iOS software development kit (SDK), and different from other platforms engines that can be interchangeably be used to create mobile apps as per the technology described herein. Mobile app plugin 331, which can be a set of libraries or modules (i.e., code package, statically linked library, dynamically linked library, etc.) provides a convenient way for the developer of the mobile app simulation to interface with the physical mobile device 102 and VR simulation 106 through networked communication.

Mobile app plugin 331 can send and receive configuration changes 342 through the API Interface via the networked data streams 340 or 356. This provides a mechanism for the mobile app simulation developer to programmatically control features and receive configuration data from the remote app (through 340) and the VR simulation (through 356). For example, this may allow a developer to turn on/off the physical device camera by having the mobile app simulation, through the mobile app plugin API interface, disable/enable the physical camera on the remote app 305 or it can do the same with the simulated camera in the VR Simulation.

The mobile app plugin 331 may listen for physical camera and microphone video/audio streams 334 from the remote app 305 via networked data. These streams are then made available to the mobile app simulation via the API Interface. For example, it can allow a developer to make direct use of the microphone in the physical mobile device 102 a user is holding.

The mobile app plugin 331 may listen for physical input and sensor data streams 338 from the remote app 305 via networked data. This input and sensor data is then made available to the mobile app simulation via the API Interface. For example, this would allow a user to receive touch inputs from the physical device and use them in their mobile app simulation.

The mobile app plugin 331 may listen for physical sensor and audio feedback 336 from the mobile app plugin API interface. The plugin can then take that sensor and audio data and convert it to a networked stream and send it back to the remote app 305. This way the remote app can properly activate a feedback sensor, such as vibration or can playback audio via the physical mobile device 102 speakers.

The mobile app plugin 331 may listen for simulated input and sensor data streams 344 from the VR simulation 106 via networked data (FIG. 3C—396). This simulated input and sensor data is then made available to the mobile app simulation via the API Interface for the developer. For example, this would allow a user to receive simulated GPS coordinates from the VR simulation to allow the mobile app simulation 104 to respond to geographic changes in the simulated VR environment 368 that the virtual mobile device 102 is being developed in.

The mobile app plugin 331 may listen for simulated camera and microphone video/audio streams 350 from the VR simulation 106 via networked data (FIG. 3C—396). This simulated video/audio data is then made available to the mobile app simulation 104 via the API interface 333 for the developer. For example, this would allow a user to receive a simulated video stream of what the virtual mobile device within the VR simulation is capturing, and a developer could use the video frames to apply mobile AR overlays on the data.

The mobile app plugin 331 may listen for rendered graphics frames 346 from the mobile app simulation through the API interface. These frames can then be converted into a networked video stream 348 to send to the VR simulation 106. This allows the VR simulation to render what the mobile app simulation is displaying on top of the virtual mobile device visualization (FIG. 3C—388).

The mobile app plugin 331 may listen for rendered audio streams 352 from the mobile app simulation 104 through the API interface. These audio streams can then be converted into a networked audio stream 356 to send to the VR simulation. This would allow the VR simulation 106 to playback audio within the VR simulation of the virtual mobile device visualization 388.

The mobile app plugin may receive/send configurations 354 from the mobile app simulation 104 through the API interface. These configurations can then be converted into a networked audio stream 356 to send to the VR Simulation. This would allow the VR simulation 106 to send/receive configurations within the VR simulation at the location of the virtual mobile device visualization 388. Various examples of configurations may include volume from an audio setting perspective, a render texture resolution for the VR simulation, etc.

FIG. 3C illustrates a VR simulation, according to some embodiments. In this embodiment, a VR simulation 106 is running on a VR PC with a VR headset (108) or on a stand-alone VR device 364. This VR simulation is created by the developer to mirror a location/environment for where their mobile app being developed can be deployed. For example, if the user is creating a mobile game that can be played in a music venue, then a new or existing simulated VR virtual environment is generated of an existing music venue. The VR virtual environment may include 3D assets for that venue so they can test their mobile device within the context of that venue.

The virtual environment consists of 3D programmatically controlled assets rendered within a game engine or similar 3D platform that allows an output to a Virtual Reality (VR) headset 108. This virtual environment would be a recreation of real-world environments/location-based entertainment (LBE) venues/indoor or outdoor installations within a Virtual Reality (VR). By combining physical and simulated data from a physical and virtual mobile device and rendering that within a VR simulation, the system provides the developer a more hands-on accurate representation and feel for how their mobile app can work at a real-world environment.

Inside of the VR simulation, the system embeds a VR plugin 365, which may be a set of libraries or modules (i.e. code package, statically linked library, dynamically linked library, etc.) that provides a convenient way for the developer of the VR simulation to render the virtual mobile device visualization 388 within the virtual environment 368 and allows the virtual mobile device to interface with the physical mobile device 102, tracking of the physical mobile device case 103, and mobile device simulation/mobile app through networked communications.

The virtual mobile device visualization 388 has a primary function of visualizing the video and audio stream from the mobile app simulation that represents the physical mobile device output. In addition, it provides a tangible, to-scale and properly positioned/oriented visualization of the phone tracker case 103 held in hand.

The virtual mobile device visualization 388 is a textured 3D mesh that is paired-up with its corresponding physical mobile device case 103. Each mobile device case can have a representative virtual mobile device that works with the mobile device case, but, in an alternate embodiment, the user can have the option of "simulating" another virtual mobile device with a non-corresponding physical mobile device case (i.e., using an iOS Physical Mobile Device, but wanting to "simulate" an Android virtual mobile device). In addition, parameters of the virtual mobile device can be offset such as scale, UI visibility, etc., for easy tracking.

Mobile device form factors can be stored in the VR plugin 365 along with a look-up table that contains valuable information for that device form factor. For example, it would store the resolution of the device, aspect ratio of the device, screen bounding rectangle coordinates relative to the physical mobile device case tracking location, and feature availability. This data can be used to properly configure the virtual mobile device visualization 388 to properly match the video resolution and other features of the physical mobile device 102.

The VR plugin 365 may receive and send configuration data 372 via the network, and this can allow the VR plugin to configure the appropriate properties (e.g., resolution of the incoming video stream from the mobile simulation, real time update synchronization, touch position recognition, etc.) for ensuring that the mobile app or mobile app simulation can be rendered/represented to visual and performative scale within the virtual mobile device. This also allows the VR simulation to communicate back to the mobile app/mobile app simulation and remote app to send configuration data that the VR user sets within the VR simulation.

With some lower resolution VR headsets, when a user holds the virtual mobile device too close to their head mounted display (HMD) eyes (i.e., connected to a virtual set of cameras within the VR virtual environment which enable the user to see the virtual environment through their headset), the screen of the mobile phone becomes slightly degraded in quality. Scaling the phone scale from 1:1 (proper world scale) to 2:1 or another ratio, gives additional clarity by enlarging the virtual mobile device visualization 388. This allows the user to still control a physical mobile device, but the VR simulation enlarges it as needed.

The VR plugin 365 can make use of information from the outside-in 202 or inside-out tracking 206 of the physical mobile device case 103. With this tracking information, the VR plugin 365 calculates the mobile device case position and orientation 376 relative to the VR headset (108) and the virtual environment and sets the position and orientation of the virtual mobile device 3D mesh 382 inside of the virtual environment. This allows the user to move the physical mobile device and see the corresponding virtual mobile device visualization 388 move inside of the VR simulation 106.

The VR plugin 365 may also listen for video/audio streams 374 on the network. It can take the audio stream and stream it into a 3D audio source that is parented to the virtual mobile device position and orientation. The game engine or platform that is running the VR simulation can mix and render that audio (map 380) in 3D within the VR environment. It can also take the video stream and, depending on the virtual mobile device configuration, can enable an AR simulation mode (378). The AR simulation mode would consist of a user accessible toggle which would enable the recognition of a separate video stream from the mobile simulation if the mobile simulation uses a separate camera collecting AR visuals in addition to the primary visuals streamed. If the AR simulation mode is not enabled, then it can map the video stream texture onto the 3D Mesh 386. If the AR simulation mode is enabled, it can merge the video stream with the virtual camera 384 that is attached to the virtual mobile device.

The VR plugin 365 attaches a virtual camera and virtual microphone 390 to the virtual mobile device visualization 388, at the location/coordinates of where the camera and microphone would exist on the physical device, provide by the configuration look-up table for that device, and uses this virtual camera and microphone to capture video and/or audio of the virtual scene from the position of the virtual mobile device. The video is captured as frames taken from the virtual camera into a render target. This render target/graphics buffer may then be merged with the video stream from the mobile app simulation to provide a simulated mobile AR experience within the VR simulation. This video and audio can also be converted back into a network data stream and sent back to the mobile app simulation.

The VR plugin 365 can also simulate the virtual position and orientation 394 of the virtual mobile device 388 relative to the virtual environment which can either be sent back 396 to the network for the mobile app simulation (344/350) to use, or can be converted to simulated sensor data 392. For example, by taking the position and orientation of the virtual mobile device within the VR simulation, the system can convert that information to GPS coordinates that can be sent back to the network for the mobile app simulation 104 to make use of as simulated sensor data. Other types of sensor data can also be simulated and sent back, such as simulated GPS coordinates relative to a virtual origin, simulated accelerometer events, simulated gyroscope events, simulated LIDAR sensor data points from the environment, simulated Augmented Reality (AR) anchor, plane, feature points relative to the virtual environment, and simulated ambient light readings.

The VR simulation can also share simulated sensor data such as anchor, plane, and feature points with the mobile app simulation so that the mobile app simulation can overlay objects, through the use of the alpha/AR overlay, within the VR environment. This leads to an effect that makes it feel like the user is using a real mobile device with AR capabilities within the VR environment.

Figure 4:
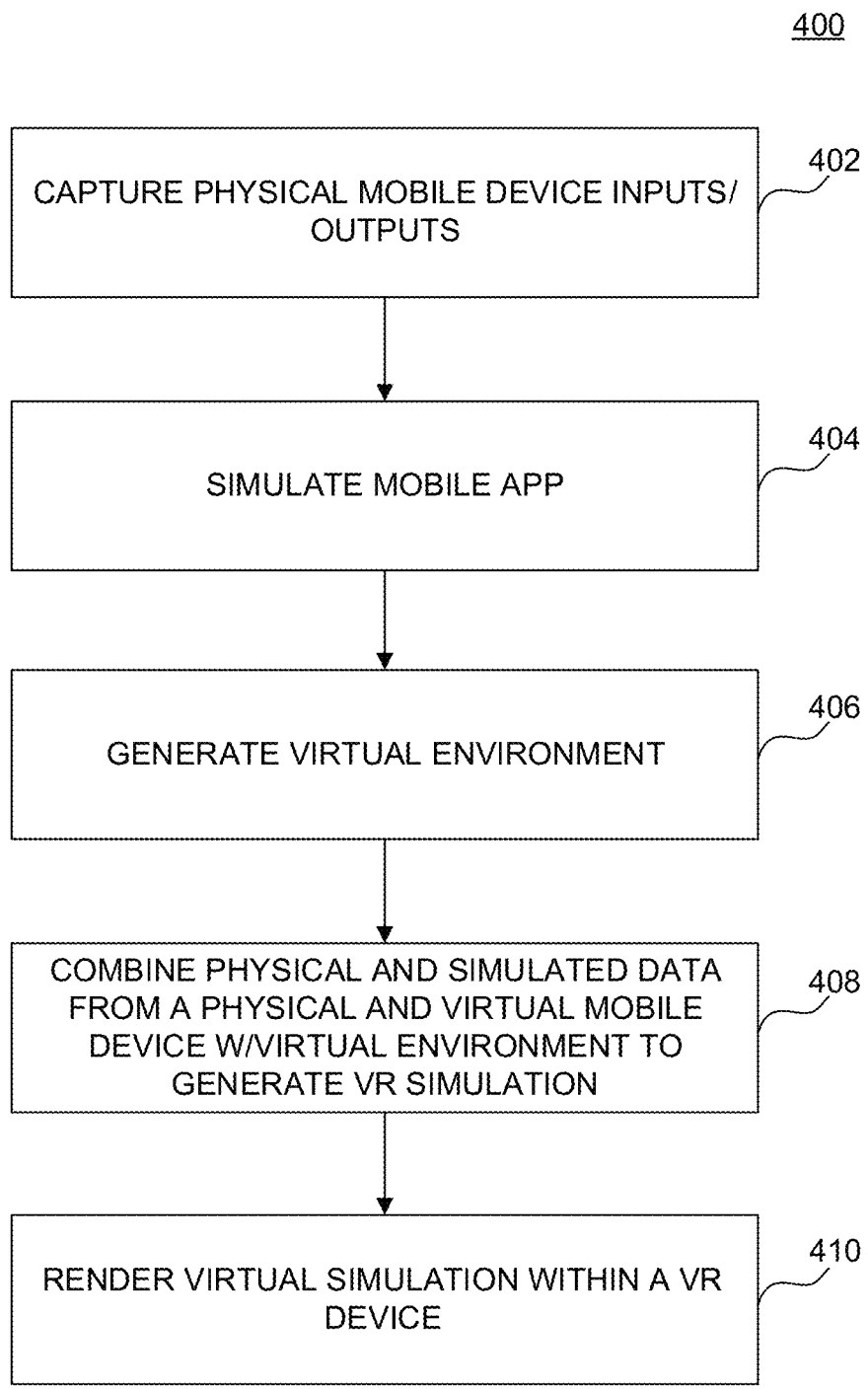
FIG. 4 illustrates a flowchart for a virtual mobile device visualization within a virtual reality (VR) simulation, according to some embodiments.

FIG. 4 illustrates a flow diagram for a virtual mobile device visualization within a virtual reality (VR) simulation, according to an embodiment.

In 402, a physical mobile device monitors and captures inputs/outputs. A physical mobile device remote application is configured to detect/transmit/receive device data to a mobile app simulation. For example, remote app 305 is configured to listen and control various physical mobile device data points (e.g., audio, video, camera, sensor inputs/outputs, and device configuration).

In 404, a mobile app simulator simulates a mobile app operation using data from the physical mobile device. For example, a mobile app plugin is configured to listen and control various physical mobile device data points and convert these data points to network streams (e.g., rendered video, audio, and configuration) to be communicated with a virtual simulation.

In 406, a virtual environment simulation (e.g., real-world location imagery simulation) is generated. In some embodiments, a virtual environment simulation virtually recreates context and physical real-world environments/LBE venue/outdoor or indoor installations where the mobile app can be used. For example, imagery from the real-world environment may be collected by video, pictures, LIDAR scans, pre-recorded imagery, sculpted 3D virtual environments, etc. This imagery is then used to generate a virtual environment simulation of the real-world environment that can then be rendered on a stand-alone computer or on a virtual reality (VR) headset. In some embodiments, the virtual environment has been previously generated (e.g., by a venue) and therefore, virtual environment simulation requires only rendering at this step.

In 408, the virtual environment simulation is combined with the physical and simulated data from the physical mobile device 102 and virtual mobile device visualization 388 to form a VR simulation.

In 410, the VR simulation is rendered (drawn) within a VR device (e.g., VR headset 108 or VR PC)

FIG. 5 illustrates a system 500 for a virtual mobile device visualization within a virtual reality (VR) simulation, according to some embodiments. Physical mobile device 602 may include a remote app with corresponding process flows as described in greater detail in FIG. 6A. A mobile app development PC 604 (executing a mobile app simulation) and corresponding process flows are detailed hereafter in association with FIG. 6B. VR PC or Standalone VR device 606 generates a VR simulation with video pass-through to test the mobile application as detailed hereafter in association with FIG. 6C. For example, the system tracks boundary coordinates of a mobile device to provide a video pass-through visualization of the physical mobile device screen by cropping a video feed from the VR headset 108 and passing it to the mobile device to be displayed on its screen.

This system's architecture is similar to that of FIGS. 3A-3C, but instead of rendering frames from the mobile app simulation and mapping that onto the virtual mobile device visualization directly, it converts the rendered frames to a networked video stream and communicates it the physical mobile device 602 display/screen. Then the virtual mobile device visualization uses a cropped video pass-through capture, using the VR headset's cameras, to overlay or mask the cropped video of the physical mobile device onto the virtual mobile device visualization. For example, this is like poking a window from VR into the real-world so you can see the physical mobile device and your fingers while playing it.

In various embodiments, Outside-In tracking 202 and Inside-Out tracking 206 methods are configured to track a physical mobile device 602 screen bounding rectangle for captured video within VR headset 108. To render a cropped VR headset captured video, a physical mobile device 602 screen bounding rectangle is tracked.

Outside-In tracking 202 makes use of external cameras located near (e.g., same room) the VR headset 108. The external cameras implement tracking of a physical mobile device case 103 relative to the position of the VR headset 108. In some embodiments, the tracking case 103 is securely attached to the physical mobile device and includes various tracking elements, such as GPS, gyroscopes, accelerometers, magnetometers, structured light systems, identifiable markings around a perimeter of the case, etc.

In one embodiment, it is also possible to visualize a user's hands within VR by making use of a 3D model of hands or finger tracking to track where on the screen they are touching and moving to match touch poses. These hand/finger tracking methods can also be used with both Outside-In and Inside-Out tracking using one or more cameras and/or sensors.

In one embodiment, screen boundary coordinates are tracked with Outside-In tracking 202. Since a location of the tracker relative to the physical edges of the mobile device case 103 is known, a pre-determined measured look-up table of relative distances from the edges of each physical mobile device case (e.g., known dimensions of cases to smartphone dimensions including screen size) with respect to the location and orientation of the tracker is created. This provides a calculated location of the mobile device case's bounding rectangle that can be used within the VR Simulation.

Inside-Out tracking 206 makes use of onboard cameras on a VR headset to track objects using machine vision techniques, without the use of external base stations or external cameras. VR headsets support inside-out tracking for the headset position. These headsets track active lights on VR controllers and use machine vision techniques to track the motion of the lights/markers, then since they know the exact position of those markers, they can calculate the orientation and position of the VR controllers. This similar technique can be used for inside-out tracking 206 of a custom-built mobile device case that includes lights and/or markers.

In one embodiment, active tracking cases, may include lights (visible or infrared) that surround the mobile device case powered by the physical mobile device 602 or batteries. The lights can have various positions around the mobile device case 103. These lights allow the VR Headset to track the position of the mobile phone in space by triangulating between three or more known light positions on the case and by knowing the dimensions of the mobile device case 103.

With this information, an approximate 3D location of the phone in space relative to the VR headset 108 camera position is calculated.

Figure 6A:
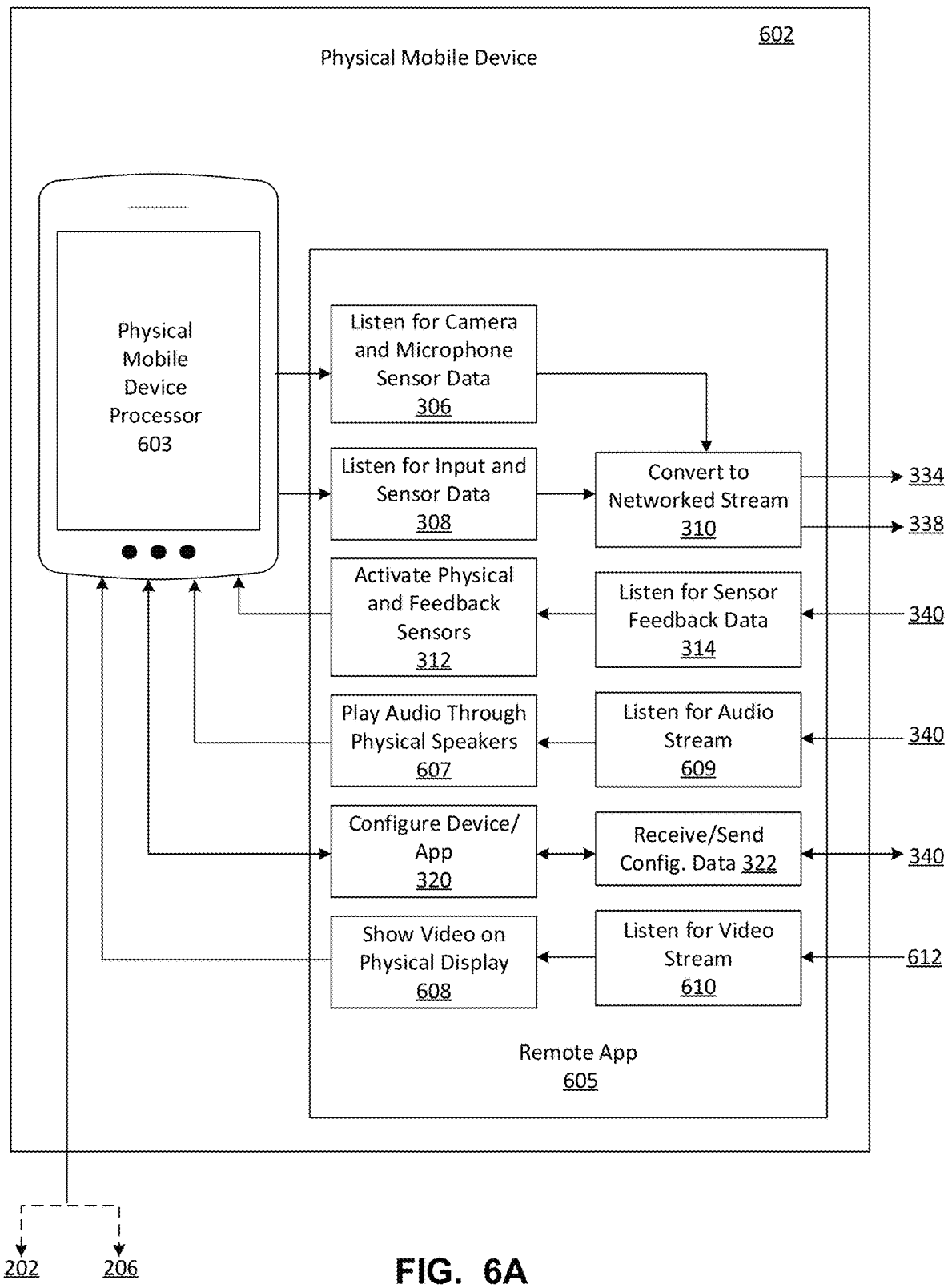
FIG. 6A illustrates a physical mobile device with mobile device case, according to some embodiments.
Figure 6B:
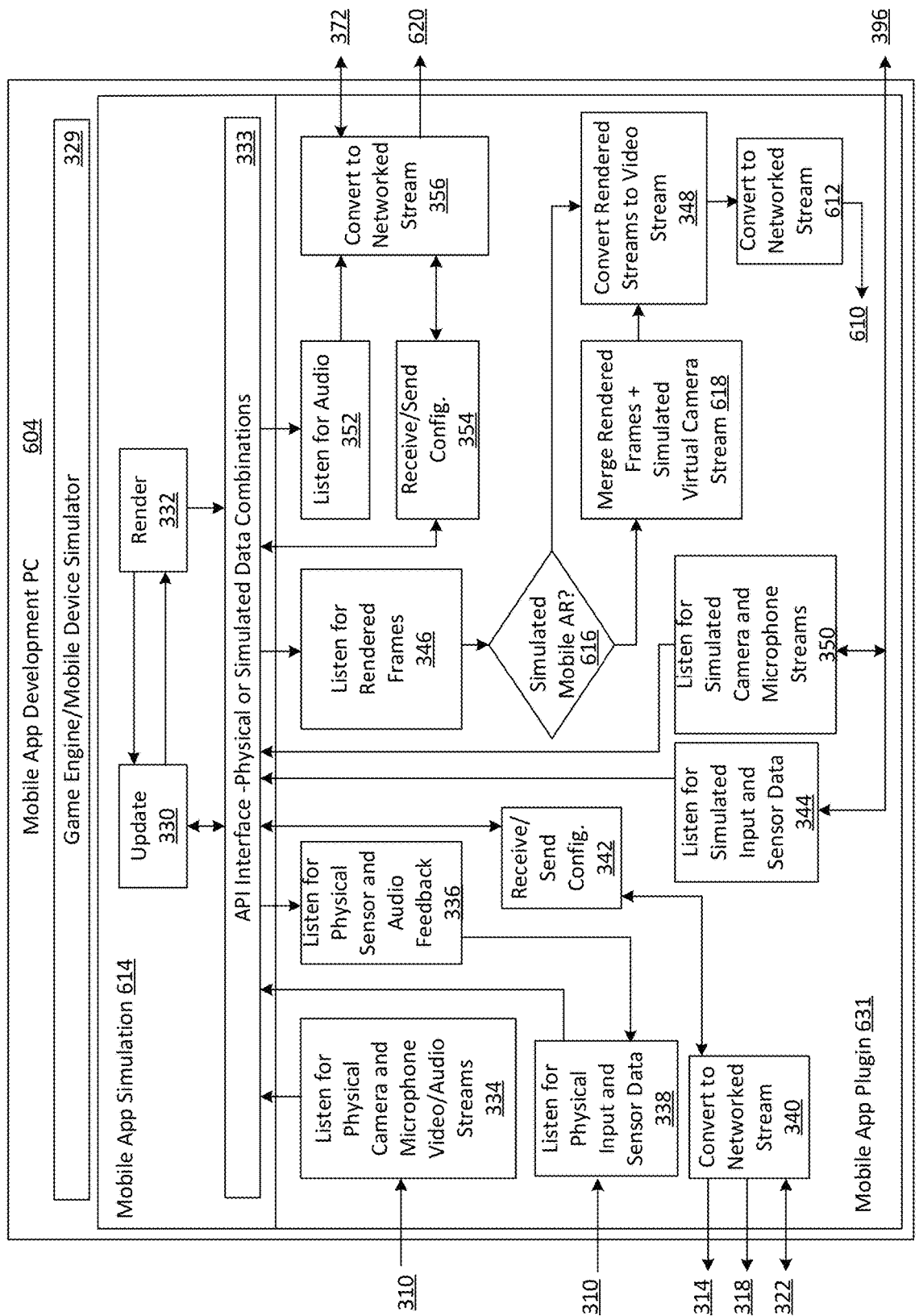
FIG. 6B illustrates a mobile app simulation, according to some embodiments.
Figure 6C:
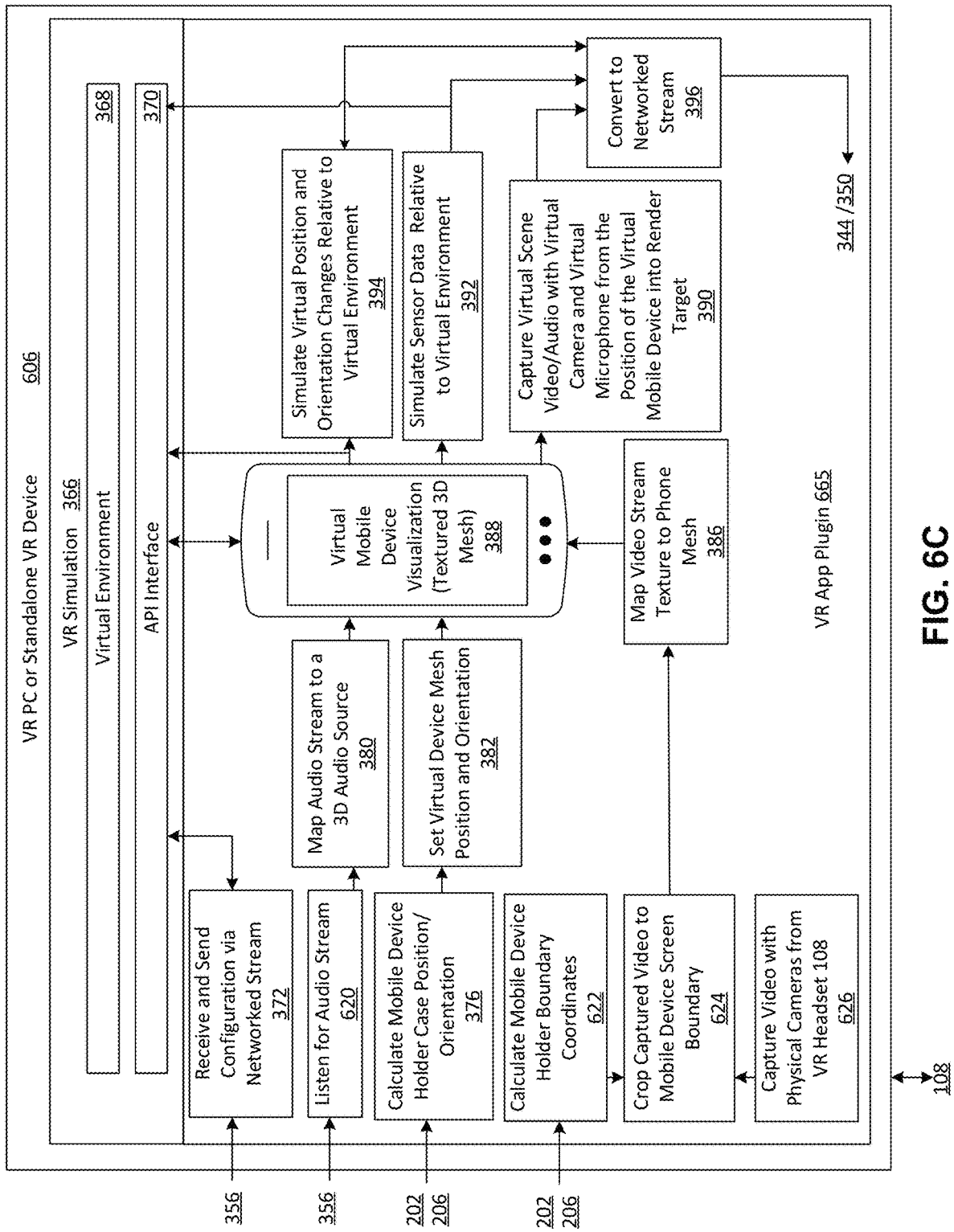
FIG. 6C illustrates a VR simulation with video pass-through virtual mobile device visualization, according to some embodiments.

FIG. 6A-6C collectively illustrate an operational flow for a virtual mobile device visualization within a virtual reality (VR) simulation, according to some embodiments. An overall system architecture may include, in FIG. 6A, a physical mobile device 602 running a remote app 605, in FIG. 3C, a mobile app development PC 604 running a mobile app simulation 614 and, in FIG. 3C, a VR PC or standalone VR device 606 in a VR simulation 366. System 500 provides support for transmitting and combining simulated and physical inputs, camera, microphone, sensor, display, and audio data between remote app 605 running on a physical mobile device 602, and a mobile app simulation 614 running and being developed on a mobile app development PC 604 and a VR simulation 366. The VR simulation virtually recreates the context and physical real-world environments/LBE venues/outdoor or indoor installations where the mobile app can be used.

FIG. 6A illustrates a physical mobile device, according to some embodiments. As previously described in FIG. 1, a mobile device case 103 (not shown) attaches to physical mobile device 602 in the real world to communicate with outside-in tracking 202 or inside-out tracking 206 of its physical location coordinates and screen boundary coordinates relative to a virtual origin within a VR simulation.

Physical mobile device 602 is, for example, a smartphone. The physical mobile device gets inserted (secure attachment) into a custom tracking case 103 that is configured to track the mobile device's position relative to a location of the custom tracking case within the VR simulation (e.g., headset 108). The mobile device's position in the VR simulation occurs relative to its position adjacent to the VR device and tracked accordingly in the VR simulation.

Physical mobile device 602 may have a remote app 605 installed and executed on computer processor 603. This remote app is configured to listen and control various physical mobile device data points. For example, the remote app may listen for camera and microphone sensor data 306 and physical inputs and sensor data 308. Detected data are converted to a network stream 310 and communicated to the mobile app simulation 614 (FIG. 3B—334 and 338). In another example, the remote app 305 may turn on/off lights or camera flash/flashlight, etc.

In addition, the remote app may activate/control the physical mobile device's feedback sensors based on sensor feedback data from the mobile app simulation 614 (FIG. 3B—340). Sensor activation may include, but is not limited to, physical and feedback sensors 312 such as haptics and vibrations based on listening for sensor feedback data 314. Some examples of input data are touch and drag events, touch gesture events (i.e., swipe left/up/down/right, double taps, other swipes and gesture patterns, etc.), and motion gesture events (i.e., shake the mobile device, shake left, shake right, orient the device in portrait or landscape, etc.). Some examples of sensor data are GPS events, accelerometer events, gyroscope events, LIDAR sensor data (front and back LIDAR cameras for scanning, face tracking, AR, etc.), Camera/LIDAR AR anchor, plane, feature points, and ambient light sensors. This is useful for the mobile app simulation to make use of all the physical mobile device feedback mechanisms for a user that is holding the physical mobile device to feel.

In addition, audio streams can be activated 607. For example, audio can be played through the physical speakers based on listening for an audio stream 609. The remote app 605 may play audio through the physical device speakers based on simulated audio streams it receives from the mobile app simulation. This may allow the mobile app simulation to play audio directly through the physical mobile device 602 so that a user of the device can hear in the real world.

The remote app 605 may turn on/off the mobile device camera, microphone, input, sensors, and feedback sensors based on a configuration 322 received from the mobile app simulation 614 (FIG. 6B—340) and VR Simulation 366 (FIG. 6C). In this way, the remote app 605 can enable/disable features by configuring the device/app 320 needed for the current mobile app simulation being developed. For example, the remote app 605 may use camera (front and back cameras) video and microphone audio sensor data and convert that to a networked stream to send to the mobile app simulation.

Similarly, the remote app 605 may send configuration data to the mobile app simulation 614 and VR simulation 366 (through FIG. 6C—372). For example, the remote app can identify which phone form factor or specifications it is running on and transmit that configuration data back to the VR simulation 366 so that the virtual mobile device visualization 388 can choose the appropriate mesh and screen dimensions/resolution to display within the VR Simulation.

Video/imagery may be displayed (video pass-through) on the physical display/screen 608 based on listening for video/imagery streams 610 from the mobile app simulation 614 (from FIG. 6B—610). For example, rendered frames are converted to a video stream (FIG. 6B—348), converted to a network stream (FIG. 6B—612) and communicated to listening functionality 610 in remote app plugin 605.

FIG. 6B illustrates a mobile app simulation, according to some embodiments. In the previously described process flow of FIG. 6A, inputs, camera, microphone, sensor data, and configurations are converted into a networked data stream to transmit and receive between the remote app 305, mobile app simulation 614, and VR simulation 366, and other parts of system 500.

In one embodiment, networked data streams between the remote app, mobile app simulation, and VR simulation may be implemented using a networking library that makes use of an underlying network transport protocol, such as UDP or TCP, and using a known application protocols (networking protocols) for custom data transfer and using known streaming networking protocols for video/audio streaming. These known application protocols typically contain libraries allowing a variety of data types to encode and decode the data at each device or computer and make use of the data or corresponding video/audio streams.

This networked communication can happen locally, such as peer-to-peer between devices or through a centralized server that can communicate with all the devices on the system either wired (i.e., using Ethernet or USB) or wirelessly (i.e., using WiFi, Bluetooth or mobile communications standards).

If the mobile app simulation 614 and the VR Simulation 366 are running on the same computer, they can also make use of faster local GPU frame buffer sharing protocols. These sharing protocols allow the running applications to share frame buffers thereby bypassing the network and allowing for faster updates and higher framerates.

In one embodiment, mobile app simulation 614 is executed inside of a game engine/mobile device simulator 329 on the mobile app development PC 604.

The mobile app simulation 614 is a simulation of the custom mobile application that the developer is creating, testing, debugging, etc. This mobile app simulation can eventually be developed into a mobile app that can be deployed onto a mobile device for testing on physical hardware, but with the technology tools described herein, the system may test the app on physical mobile device hardware while it's running on the mobile app development PC 604. This can allow for faster iteration times by allowing the developer to make changes and fixes to the mobile app simulation in real-time without needing to continuously redeploy the mobile app on the mobile device.

The mobile app simulation 614 has a standard update/render loop. The update process 330 updates the mobile app simulation 614 state by taking in input data from various sources, programmatically changing the application state, and programmatically communicating and updating external data sinks. In the above example, the mobile app simulation 614 communicates with the API interface 333 of mobile app plugin 631. The mobile app plugin 631 communicates directly with mobile app simulation 614 through its update/render loop to provide data and receive data for modifying the application state and receives the rendered graphics and audio content. The mobile app simulation 614 communicates through the API interface to access the various subsystems of the mobile app plugin 631.

After the update process 330 has updated the state of the application, the render process 332 can take the application state and draw/update 2D and 3D graphics buffers and can update audio buffers to prepare for displaying on screen and outputting to the audio system. In various embodiments, there can be more than one update and render process and some may run in parallel in different mobile app systems. For example, the update/render loop in a game engine, is different than that of the iOS software development kit (SDK), and different from other platforms engines that can be interchangeably be used to create mobile apps as per the technology described herein. Mobile app plugin 631, which can be a set of libraries or modules (i.e., code package, statically linked library, dynamically linked library, etc.) provides a convenient way for the developer of the mobile app simulation to interface with the physical mobile device 602 and VR simulation 366 through networked communication.

Mobile app plugin 631 can send and receive configuration changes 342 through the API Interface through the networked data streams 340 or 356. This provides for the mobile app simulation developer to programmatically control features and receive configuration data from the remote app (through 340) and the VR simulation (through 356). For example, this may allow a developer to turn on/off the physical device camera by having the mobile app simulation, through the mobile app plugin API interface, disable/enable the physical camera on the remote app 605 or it can do the same with the simulated camera in the VR Simulation.

The mobile app plugin 631 may listen for physical camera and microphone video/audio streams 334 from the remote app 605 via networked data. These streams are then made available to the mobile app simulation via the API Interface. For example, it can allow a developer to make direct use of the microphone in the physical mobile device the user is holding.

The mobile app plugin 631 may listen for physical input and sensor data streams 338 from the remote app 605 via networked data. This input and sensor data is then made available to the mobile app simulation via the API Interface. For example, this would allow a user to receive touch inputs from the physical device and use them in their mobile app simulation.

The mobile app plugin 631 may listen for physical sensor and audio feedback 336 from the mobile app plugin API interface. The plugin can then take that sensor and audio data and convert it to a networked stream and send back to the remote app 605. This way the remote app can properly activate a feedback sensor, such as vibration or can playback audio via the physical device speakers.

The mobile app plugin 631 may listen for simulated input and sensor data streams 344 from the VR simulation 366 via networked data (FIG. 3C—396). This simulated input and sensor data is then made available to the mobile app simulation via the API Interface for the developer. For example, this would allow a user to receive simulated GPS coordinates from the VR simulation to allow the mobile app simulation 614 to respond to geographic changes in the simulated VR environment 368 that the virtual mobile device is being developed in.

The mobile app plugin 631 may listen for simulated camera and microphone video/audio streams 350 from the VR simulation 366 via networked data (FIG. 3C—396). This simulated video/audio data is then made available to the mobile app simulation 614 via the API Interface 333 for the developer. For example, this would allow a user to receive a simulated video stream of what the virtual mobile device within the VR simulation is capturing, and a developer could use the video frames to apply mobile AR overlays on the data.

The mobile app plugin 631 may listen for rendered graphics frames 346 from the mobile app simulation through the API interface. The VR plugin 665 (FIG. 6C) may take the video stream and, depending on the virtual mobile device configuration, can enable an AR simulation mode (616). If the AR simulation mode is not enabled, then it can convert rendered streams 348 to a video stream and then convert to a network stream 612 for physical mobile device 602 (FIG. 6A—610). If the AR simulation mode is enabled, it can merge the video stream with a simulated virtual camera 618 and pass to the rendered stream converter 348.

The mobile app plugin 631 may listen for audio streams 352 from the mobile app simulation 614 through the API interface. These audio streams can then be converted into a networked audio stream 356 to send to the VR simulation 366. This would allow the VR simulation 366 to playback audio within the VR simulation of the virtual mobile device visualization 388.

The mobile app plugin may receive/send configurations 354 from the mobile app simulation 614 through the API interface. These configurations can then be converted into a networked audio stream 356 to send to the VR simulation. This would allow the VR simulation 366 to send/receive configurations within the VR simulation at the location of the virtual mobile device visualization 388.

FIG. 6C illustrates a VR simulation, according to some embodiments. In this embodiment, a VR simulation 366 is running on a VR PC with a VR Headset (108) or on a stand-alone VR device 602. A virtual environment 368 is created by the developer to mirror a location/environment for where their mobile app being developed can be deployed. For example, if the user is creating a mobile game that can be played in a music venue, then they would create a VR virtual environment with 3D assets for that venue so they can test their mobile device within the context of that venue.

The virtual environment consists of 3D programmatically controlled assets rendered within a game engine or similar 3D platform that allows an output to a Virtual Reality (VR) headset 108. This virtual environment would be a recreation of real-world environments/location-based entertainment (LBE) venues/indoor or outdoor installations within a Virtual Reality (VR). By combining physical and simulated data from a physical and virtual mobile device and rendering that within a VR simulation, the system provides the developer a more hands-on accurate representation and feel for how their mobile app can work at a real-world environment.

Inside of the VR simulation, the system embeds a VR plugin 365, which can be a set of libraries or modules (i.e. code package, statically linked library, dynamically linked library, etc.) that provides a convenient way for the developer of the VR simulation to render the virtual mobile device visualization 388 within the virtual environment 368 and allows the virtual mobile device to interface with the physical mobile device 602, tracking of the physical mobile device case 103, and mobile device simulation/mobile app through networked communications.

The virtual mobile device visualization 388 has a primary function of visualizing the video and audio stream from the mobile app or mobile app simulation that represents the physical mobile device output. In addition, it provides a tangible, to-scale and properly positioned/oriented visualization of the phone tracker case 103 held in hand.

The virtual mobile device visualization 388 is a textured 3D mesh that is paired up with its corresponding physical mobile device case 103. Each mobile device case can have a representative virtual mobile device that works with the mobile device case, but, in an alternate embodiment, the user can have the option of "simulating" another virtual mobile device with a non-corresponding physical mobile device case (i.e., using an iOS Physical Mobile Device, but wanting to "simulate" an Android virtual mobile device)

Mobile device form factors can be stored in the VR plugin 365 along with a look-up table that contains valuable information for that device form factor. For example, it would store the resolution of the device, aspect ratio of the device, screen bounding rectangle coordinates relative to the physical mobile device case tracking location, and feature availability. This data can be used to properly configure the virtual mobile device visualization 388 to properly match the video resolution and other features of the physical mobile device 102.

The VR plugin 365 may receive and send configuration data 372 via the network, and this can allow the VR plugin to configure the appropriate properties (e.g., resolution of the incoming video stream from the mobile simulation, real time update synchronization, and touch position recognition) for ensuring that the mobile app or mobile app simulation can be rendered/represented to visual and performative scale within the virtual mobile device. This also allows the VR simulation to communicate back to the mobile app/mobile app simulation and remote app to send configuration data that the VR user sets within the VR simulation.

With some lower resolution VR headsets, when a user holds the virtual mobile device too close to their head mounted display (HMD) eyes, the screen of the mobile phone becomes slightly degraded in quality. Scaling the phone scale from 1:1 (proper world scale) to 2:1 or another ratio, gives additional clarity by enlarging the virtual mobile device visualization. This allows the user to still control a physical mobile device, but the VR simulation enlarges it as needed.

The VR plugin 365 can make use of information from the outside-in 202 or inside-out tracking 206 of the physical mobile device case 103. With this tracking information, the VR plugin 365 calculates the mobile device case position and orientation 376 relative to the VR headset 108 and the virtual environment and sets the position and orientation of the virtual mobile device 3D mesh 382 inside of the virtual environment. This allows the user to move the physical mobile device and see the corresponding virtual mobile device visualization 388 move inside of the VR simulation 366.

The VR plugin 365 may also listen for audio streams 620 on the network. It can take the audio stream and stream it into a 3D audio source that is parented to the virtual mobile device position and orientation. The game engine or platform that is running the VR simulation can mix and render that audio (map 380) in 3D within the VR environment.

The VR plugin 365 may calculate mobile device holder 103 boundary coordinates 622, capture video from physical cameras 626 from VR headset 108, and crop the captured video to mobile device screen boundary 624, and map the video stream texture onto the 3D Mesh 386.

The VR plugin 365 attaches a virtual camera and virtual microphone 390 to the virtual mobile device visualization, at the location/coordinates of where the camera and microphone would exist on the physical device, provide by the configuration look-up table for that device, and uses this virtual camera and microphone to capture video and/or audio of the virtual scene from the position of the virtual mobile device. The video is captured as frames taken from the virtual camera into a render target. This render target/graphics buffer can then be merged with the video stream from the mobile app simulation to provide a simulated mobile AR experience within the VR simulation. This video and audio can also be converted back into a network data stream and sent back to the mobile app simulation.

The VR Plugin can also simulate the virtual position and orientation 394 of the virtual mobile device relative to the virtual environment which can either be sent back 396 to the network for the mobile app simulation (344/350) to use, or can be converted to simulated sensor data 392. For example, by taking the position and orientation of the virtual mobile device within the VR simulation, the system can convert that to GPS coordinates that can be sent back to the network for the mobile app simulation 614 to make use of as simulated sensor data. Other types of sensor data can also be simulated and sent back, such as simulated GPS coordinates relative to a virtual origin, simulated accelerometer events, simulated gyroscope events, simulated LIDAR sensor data points from the environment, simulated Augmented Reality anchor, plane, and feature points relative to the virtual environment, and simulated ambient light readings.

The VR Simulation can also share simulated sensor data such as anchor, plane, and feature points with the mobile app simulation so that the mobile app simulation can overlay objects, through the use of the alpha/AR overlay, within the VR environment. This leads to an effect that makes it feel like the user is using a real mobile device with AR capabilities within the VR environment.

Figure 7:
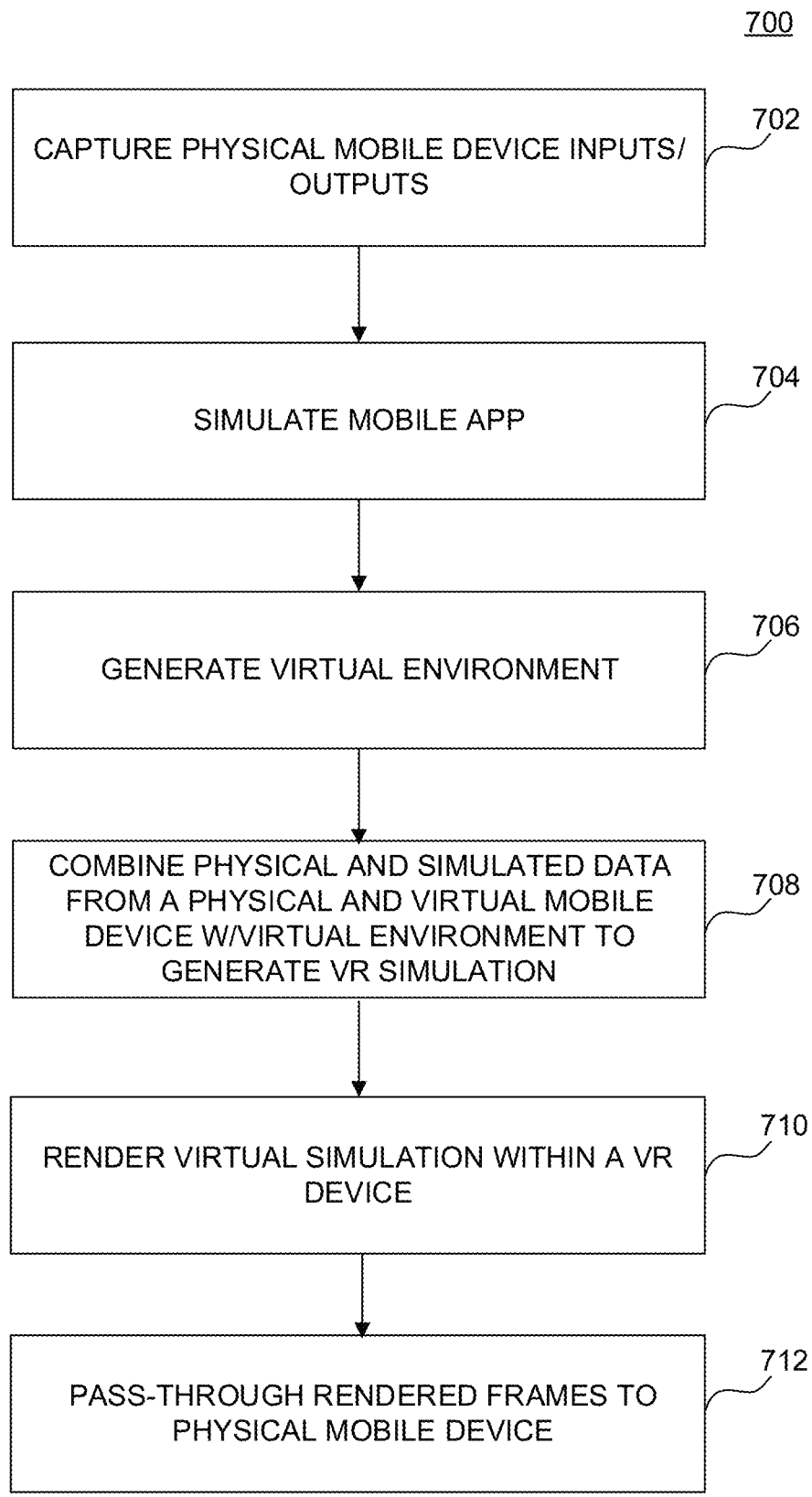
FIG. 7 illustrates a flowchart for a virtual mobile device visualization within a virtual reality (VR) simulation, according to some embodiments.

FIG. 7 illustrates a flow diagram for a virtual mobile device visualization within a virtual reality (VR) simulation, according to an embodiment.

In 702, a physical mobile device monitors and captures inputs/outputs. A physical mobile device remote application is configured to detect/transmit/receive device data to a mobile app simulation. For example, remote app 605 is configured to listen and control various physical mobile device data points (e.g., audio, video, camera, sensor inputs/outputs, and device configuration).

In 704, a mobile app simulator simulates a mobile app operation using data from the physical mobile device. For example, a mobile app plugin is configured to listen and control various physical mobile device data points and convert these data points to network streams (e.g., rendered video, audio, and configuration) to be communicated with a virtual location/environment simulation.

In 706, a virtual environment simulation (e.g., real-world location imagery simulation) is generated. In some embodiments, a virtual environment simulation virtually recreates context and physical real-world environments/LBE venue/outdoor or indoor installations where the mobile app can be used. For example, imagery from the real-world environment may be collected by video, pictures, LIDAR scans, pre-recorded imagery, sculpted 3D virtual environments, etc. This imagery is then used to generate a virtual environment simulation of the real-world environment that can then be rendered on a stand-alone computer or on a virtual reality (VR) headset. In some embodiments, the virtual environment has been previously generated (e.g., by a venue) and therefore, virtual environment simulation requires only rendering at this step.

In 708, the virtual environment simulation is combined with the physical and simulated data from the physical mobile device 602 and virtual mobile device visualization 388 to form a VR simulation 366.

In 710, the VR simulation is rendered (drawn) within a VR device (e.g., VR headset 108 or VR PC).

In 712, video in the VR device representing the screen (display) on the mobile device is passed-through to the physical mobile device for display thereon. For example, the system uses tracked mobile device case screen boundary coordinates to provide a video pass-through visualization of the physical mobile device screen by cropping a video feed from the VR headset based on calculated screen boundary coordinates.

Figure 8:
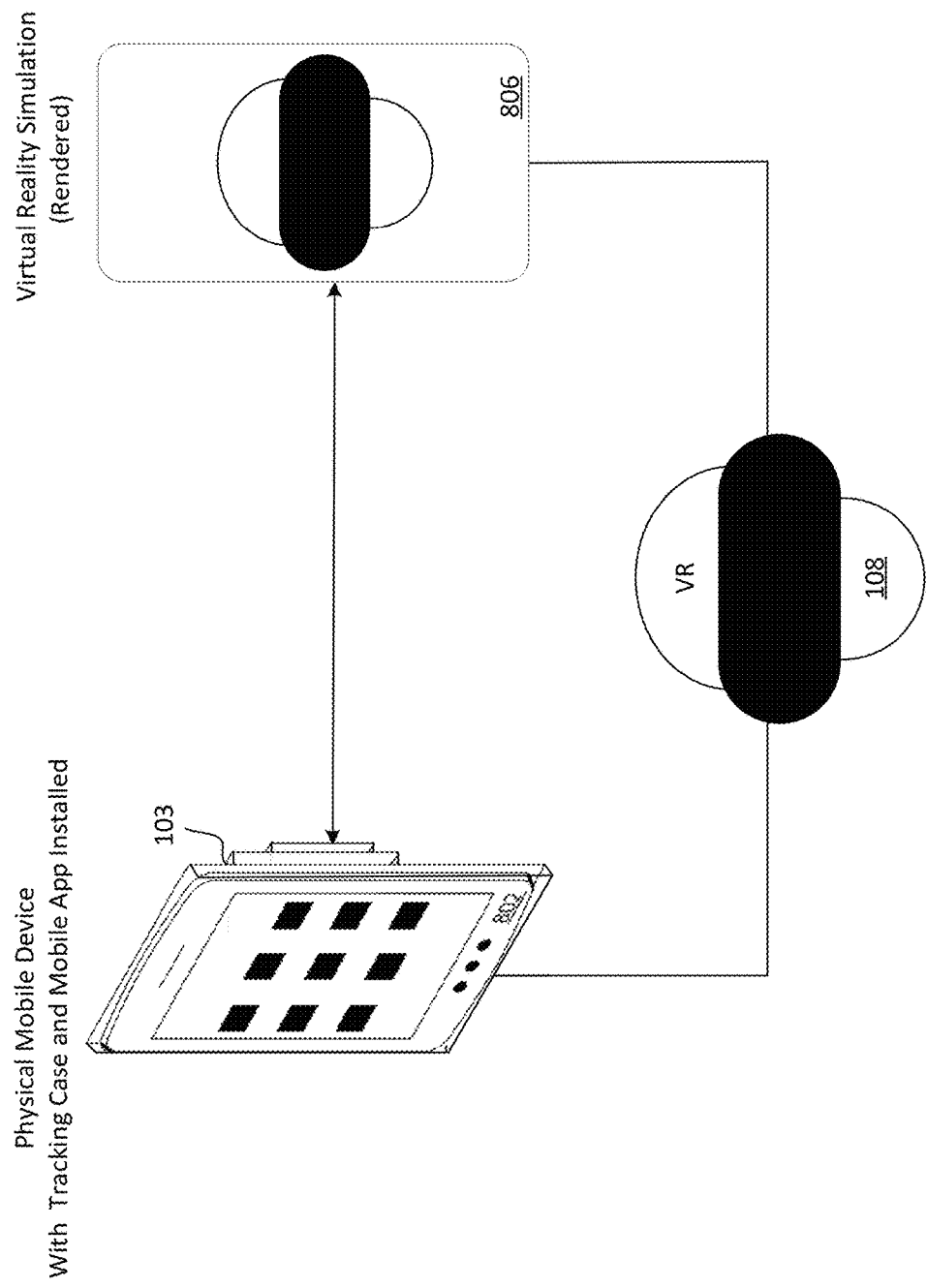
FIG. 8 illustrates a system for a virtual mobile device visualization within a virtual reality (VR) simulation, according to some embodiments.

FIG. 8 illustrates a system for a virtual mobile device visualization within a virtual reality (VR) simulation, according to some embodiments. System 800 includes physical mobile device 802 (e.g., smartphone, tablet, wearable computer, etc.) representing a real-world input/output system that may interact in a virtual reality or augmented reality environment. The physical mobile device 802, in various embodiments, includes a mobile device tracking case 103 (FIG. 1) to establish a position (e.g., location in six degrees of movement) of the mobile physical device 802 relative to Virtual Reality (VR) headset 108.

VR is a simulated experience that can be similar to the real world. Applications of virtual reality include entertainment (e.g. video games), education (e.g. medical or military training) and business (e.g. virtual meetings). Other distinct types of VR-style technology include augmented reality and mixed reality, sometimes referred to as extended reality or XR.

Currently, standard virtual reality systems use either virtual reality headsets or multi-projected environments to generate realistic images, sounds and other sensations that simulate a user's physical presence in a virtual environment. A person using virtual reality equipment is able to look around the artificial world, move around in it, and interact with virtual features or items. The effect is commonly created by VR headsets consisting of a head-mounted display with a small screen in front of the eyes, but can also be created through specially designed rooms with multiple large screens. Virtual reality typically incorporates auditory and video feedback, but may also allow other types of sensory and force feedback through haptic technology.

When developing a new VR application, especially for large scale environments, travelling to a subject location to test the application as it is being developed may not be convenient or possible. Therefore, in various embodiments described herein, a virtual mobile device visualization within a VR simulation 806 combines physical and simulated inputs, such as, but not limited to, camera, microphone, sensor, display, and audio data from the VR simulation. A mobile app under development is installed on the physical mobile device 802. In addition, in one embodiment (FIGS. 13A-13C), the system 800 uses tracked mobile device case screen boundary coordinates to provide a video pass-through visualization of the physical mobile device screen by cropping a video feed from the VR headset 108 based on calculated screen boundary coordinates of physical mobile device 802. Each of these elements will be described in greater detail hereafter.

Figure 9:
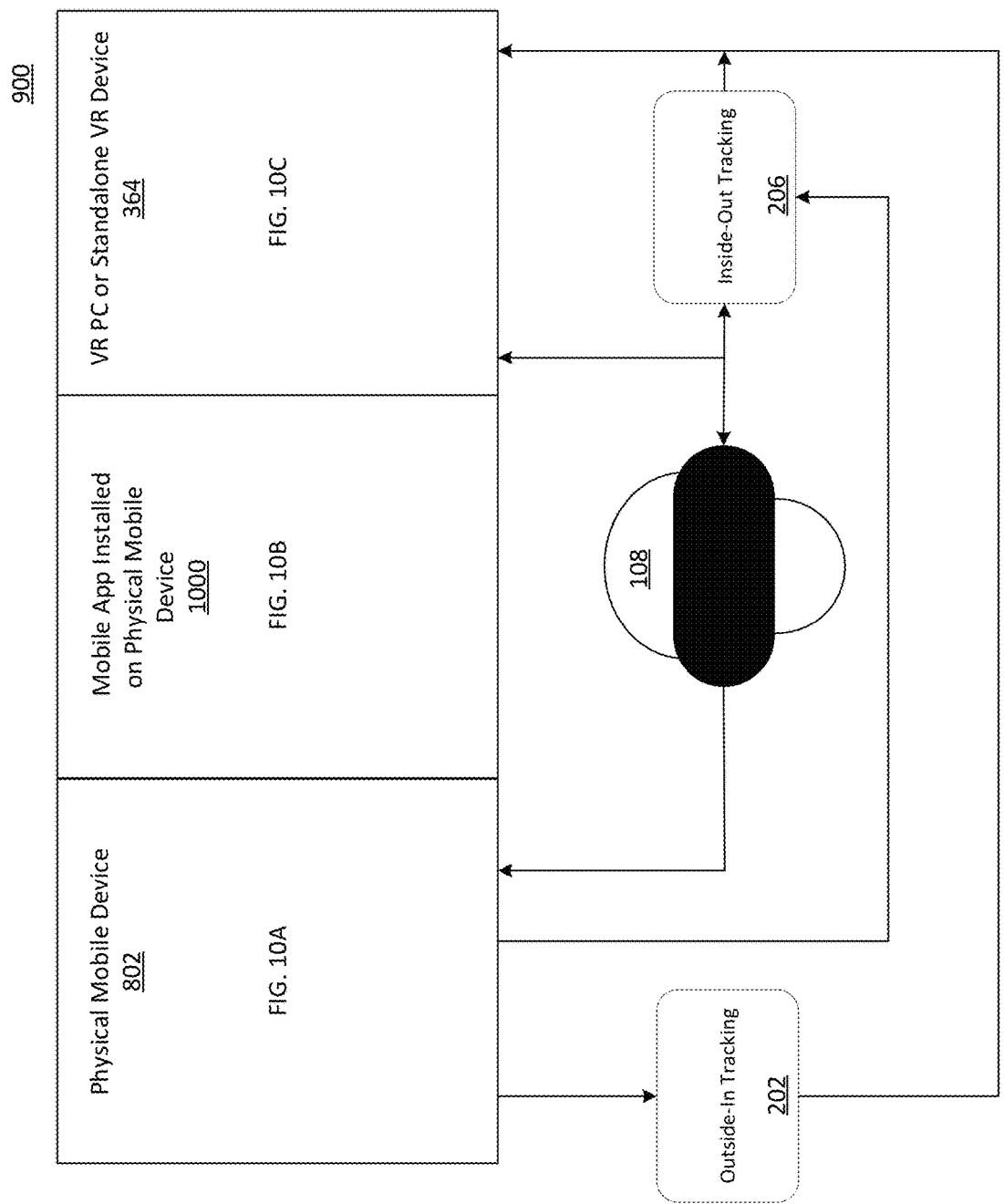
FIG. 9 illustrates a system workflow for a virtual mobile device visualization within a virtual reality (VR) simulation, according to some embodiments.

FIG. 9 illustrates a system 900 for a virtual mobile device visualization within a virtual reality (VR) simulation, according to some embodiments.

Figure 10A:
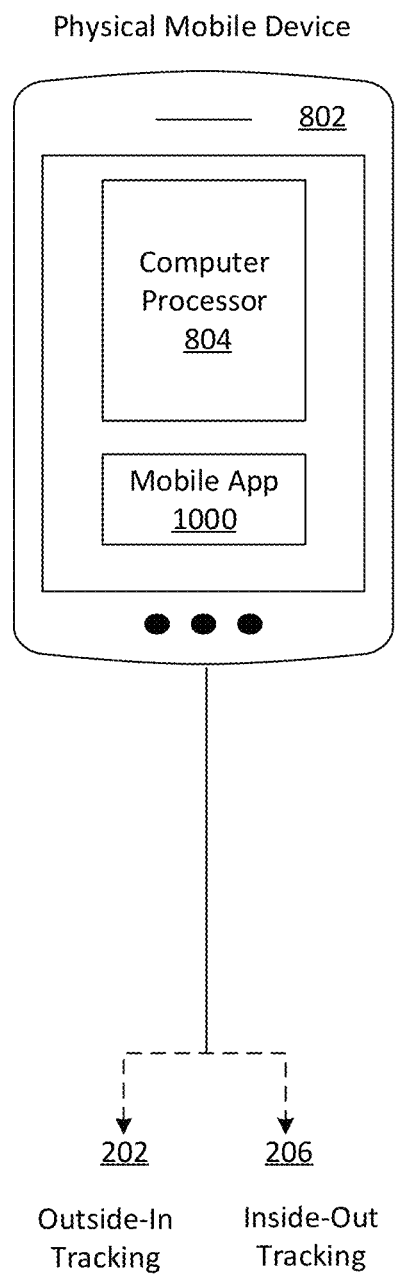
FIG. 10A illustrates a physical mobile device with mobile device case, according to some embodiments.
Figure 10B:
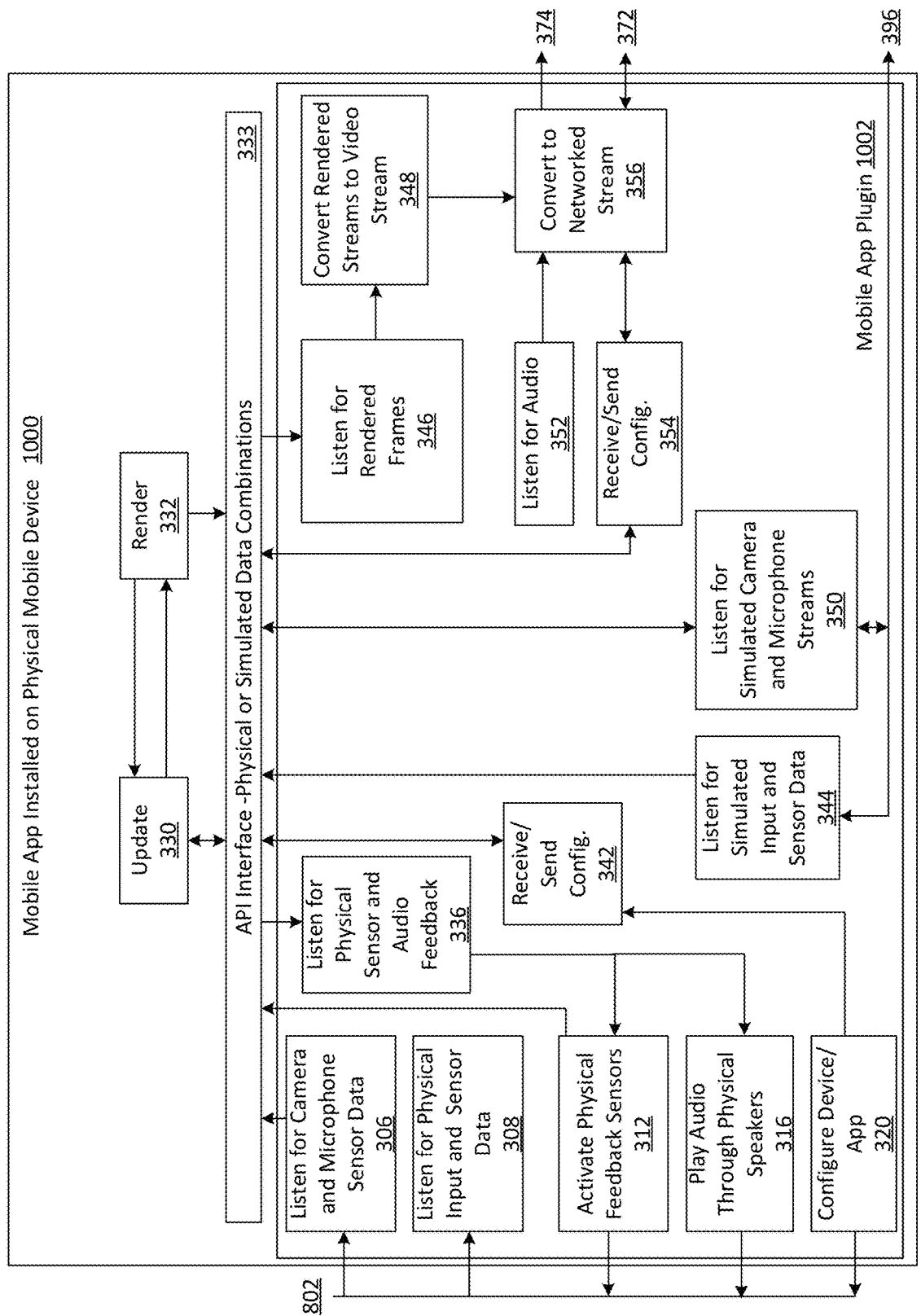
FIG. 10B illustrates an installed mobile app processing flow, according to some embodiments.

Physical mobile device 802 may include a downloaded mobile app 1000 with corresponding process flows as described in greater detail in FIG. 10B. A VR PC or Standalone VR device 364 provides a VR simulation to test the mobile application as detailed hereafter in association with FIG. 10C.

As previously described in FIG. 1, a mobile device case 103 attaches to a physical mobile device 802 in the real world to allow for precise inside-out or outside-in tracking of its physical location coordinates and screen boundary coordinates relative to a virtual origin within a VR simulation, transmitting and combining simulated and physical input, camera, microphone, sensor, display, and audio data between a VR simulation and a mobile app running on a physical mobile device.

A VR simulation 806 virtually recreates the context and physical real-world environments/LBE venues/outdoor or indoor installations, where the mobile app can be used, includes a virtual mobile device visualization within the VR simulation which combines the physical and simulated input, camera, microphone, sensor, display, and audio data from the VR simulation, the mobile app running on a physical mobile device.

This example embodiment is similar to FIGS. 3A-3C, but instead of using a separate mobile app development PC with a mobile app simulation, mobile app development is implemented directly on the physical mobile device in combination with a VR simulation. This architecture allows a developer to provide mobile app builds that QA (Quality Assurance) or stakeholders can test without needing to travel to the real-world environment.

In this embodiment, a mobile app 1000 is installed on the physical mobile device 802.

The mobile app is executed on processor 804 and may include a mobile app plugin 1002 collecting and communicating data during testing. This allows for similar functionality as FIGS. 3A-3C, but in this embodiment, the mobile app plugin 1002 interfaces directly with the physical mobile device 802.

In various embodiments, Outside-In tracking 202 and Inside-Out tracking 206 methods are configured to track a physical mobile device 802 screen bounding rectangle for captured video within VR headset 108.

Outside-In tracking 202 makes use of external cameras located near (e.g., same room) the VR headset 108. The external cameras implement tracking of a physical mobile device case 103 relative to the position of the VR headset 108. In some embodiments, the tracking case 103 is securely attached to the physical mobile device and includes various tracking elements, such as GPS, gyroscopes, accelerometers, magnetometers, structured light systems, identifiable markings around a perimeter of the case, etc.

In one embodiment, it is also possible to visualize a user's hands within VR by making use of a 3D model of hands or finger tracking to track where on the screen they are touching and moving to match touch poses. These hand/finger tracking methods can also be used with both Outside-In and Inside-Out tracking.

In one embodiment, screen boundary coordinates are tracked with Outside-In tracking 202. Since a location of the tracker relative to the physical edges of the mobile device case 103 is known, a pre-determined measured look-up table of relative distances from the edges of each physical mobile device case (e.g., known dimensions of cases to smartphone dimensions including screen size) with respect to the location and orientation of the tracker is created. This provides a calculated location of the mobile device case's bounding rectangle that can be used within the VR Simulation.

Inside-Out tracking 206 makes use of onboard cameras on a VR headset to track objects using machine vision techniques, without the use of external base stations or external cameras. VR headsets support inside-out tracking for the headset position. These headsets track active lights on VR controllers and use machine vision techniques to track the motion of the lights/markers, then since they know the exact position of those markers, they can calculate the orientation and position of the VR controllers. This similar technique can be used for inside-out tracking 206 of a custom-built mobile device case.

In one embodiment, active tracking cases, may include lights (visible or infrared) that surround the mobile device case powered by the physical mobile device 802 or batteries. The lights can have various positions around the mobile device case 103. These lights allow the VR Headset to track the position of the mobile phone in space by triangulating between three or more known light positions on the case and by knowing the dimensions of the mobile device case 103. With this information, an approximate 3D location of the phone in space relative to the VR headset 108 camera position is calculated.

FIG. 10A illustrates a physical mobile device, according to some embodiments.

Physical mobile device 802 has a mobile app 1000 installed as well as a mobile app plugin 1002 (FIG. 10B). This mobile app plugin may be configured to listen and control various physical mobile device data points as will be discussed in greater detail in association with FIG. 10B.

Physical mobile device 802 is, for example, a smartphone. The physical mobile device gets inserted (secure attachment) into a mobile tracking case 103 (FIG. 1) that is configured to track the mobile device's position relative to a location of the custom tracking case within the VR simulation (e.g., headset 108).

Mobile tracking case 103 (not shown) when attached to the physical mobile device (304) in the real world communicates with outside-in tracking 202 or inside-out tracking 206 of its physical location coordinates and screen boundary coordinates relative to a virtual origin within a VR simulation.

FIG. 10B illustrates a mobile app processing flow, according to some embodiments. Inputs, camera, microphone, sensor data, and configurations are converted into a networked data stream to transmit and receive between the mobile app plugin and VR simulation, and other parts of system 900.

In one embodiment, networked data streams between the mobile app plugin 1002 and the VR app plugin 1004 (FIG. 10C) may be implemented using a networking library that makes use of an underlying network transport protocol, such as UDP or TCP, and using a known application protocols (networking protocols) for custom data transfer and using known streaming networking protocols for video/audio streaming. These known application protocols typically contain libraries allowing a variety of data types to encode and decode the data at each device or computer and make use of the data or corresponding video/audio streams.

This networked communication can happen locally, such as peer-to-peer between devices or through a centralized server that can communicate with all the devices on the system either wired (i.e., using Ethernet or Universal Serial Bus (USB)) or wirelessly (i.e., using WiFi, Bluetooth or mobile communications standards). In one embodiment, networked data streams between the remote app, mobile app simulation, and VR simulation may be implemented using a networking library that makes use of an underlying network transport protocol, such as UDP or TCP, and using a known application protocols (networking protocols) for custom data transfer and using known streaming networking protocols for video/audio streaming. These known application protocols typically contain libraries allowing a variety of data types to encode and decode the data at each device or computer and make use of the data or corresponding video/audio streams.

The mobile app 1000 is the custom application that the developer is creating, testing, debugging, etc. This mobile app can eventually be developed into a deployable mobile app that can be downloaded onto a mobile device for testing onsite, but with the technology tools described herein, the system may test the mobile app on the physical mobile device hardware in combination with the virtual simulation and VR headset 108.

The mobile app 1000 has a standard update/render loop. The update process 330 updates the mobile app state by taking in input data from various sources, programmatically changing the application state, and programmatically communicating and updating external data sinks. In the above example, the mobile app communicates with the API interface 333 of mobile app plugin 1002. The mobile app plugin 1002 communicates directly with the mobile app 1000 through its update/render loop to provide data and receive data for modifying the application state and receives the rendered graphics and audio content.

After the update process 330 has updated the state of the application, the render process 332 can take the application state and draw/update 2D and 3D graphics buffers and update audio buffers to prepare for displaying on-screen and outputting to the audio system. In various embodiments, there can be more than one update and render process and some may run in parallel in different mobile app systems. For example, other platforms can be interchangeably be used to create mobile apps as per the technology described herein. Mobile app plugin 1002, which can be a set of libraries or modules (i.e., code package, statically linked library, dynamically linked library, etc.) provides a convenient way for the developer of the mobile app to interface with the physical mobile device 802 and VR simulation 806 through networked communication.

Mobile app plugin 1002 may listen for camera and microphone sensor data 306 and physical inputs and sensor data 308. For example, the mobile app plugin 1002 may turn on/off lights or camera flash/flashlight, etc.

Mobile app plugin 1002 may activate/control the physical mobile device's feedback sensors 312. Sensor activation may include, but is not limited to, physical and feedback sensors such as haptics and vibrations based on listening for sensor and audio feedback data 336. Some examples of input data are touch and drag events, touch gesture events (i.e., swipe left/up/down/right, double taps, other swipes and gesture patterns, etc.), and motion gesture events (i.e., shake the mobile device, shake left, shake right, orient the device in portrait or landscape, etc.). Some examples of sensor data are GPS events, accelerometer events, gyroscope events, LIDAR sensor data (front and back LIDAR cameras for scanning, face tracking, AR, etc.), Camera/LIDAR AR anchor, plane, feature points, and ambient light sensors. This is useful for the mobile app to make use of all the physical mobile device feedback mechanisms for a user that is holding the physical mobile device to feel.

Mobile app plugin 1002 may activate audio streams 316. For example, audio can be played through the physical speakers based on listening for an audio stream.

Mobile app plugin 1002 may turn on/off the mobile device camera, microphone, input, sensors, and feedback sensors based on a configuration 320. In this way, the mobile app plugin 1002 can enable/disable features by configuring 320 the device/app needed for the current mobile app being developed. For example, the mobile app plugin 1002 may use camera (front and back cameras) video and microphone audio sensor data. Mobile app plugin 1002 can send and receive configuration changes (342 or 354) through the API Interface as networked data streams 340 or 356.

Figure 10C:
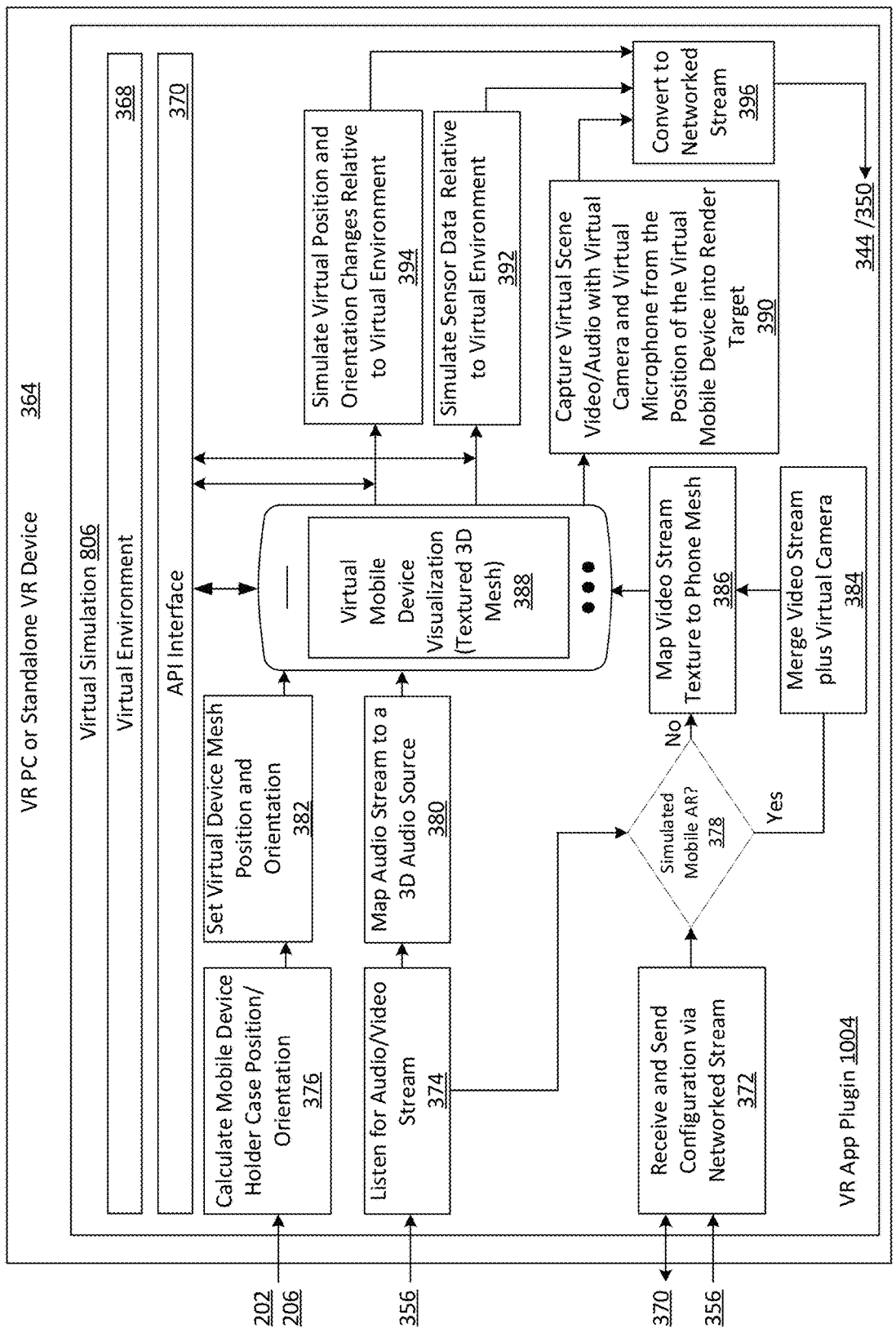
FIG. 10C illustrates a VR simulation with rendered virtual mobile device visualization, according to some embodiments.

Mobile app plugin 1002 may listen for simulated input and sensor data streams 344 from the VR simulation 806 via networked data (FIG. 10C—396). This simulated input and sensor data is then made available to the mobile app via the API Interface for the developer. For example, this would allow a user to receive GPS coordinates from the VR simulation to allow the mobile app to respond to geographic changes in the simulated VR environment 368 that the virtual mobile device 802 is being developed in.

Mobile app plugin 1002 may listen for simulated camera and microphone video/audio streams 350 from the VR simulation 806 via networked data (FIG. 10C—396). This simulated video/audio data is then made available to the mobile app via the API interface 333 for the developer. For example, this would allow a user to receive a simulated video stream of what the virtual mobile device within the VR simulation is capturing, and a developer could use the video frames to apply mobile AR overlays on the data.

Mobile app plugin 1002 may listen for rendered graphics frames 346 from the mobile app through the API interface. These frames can then be converted into a networked video stream 348 to send to the VR simulation 806. This allows the VR simulation to render what the mobile app is displaying on top of the virtual mobile device visualization (FIG. 10C—388).

Mobile app plugin 1002 may listen for rendered audio streams 352 from the mobile app through the API interface. These audio streams can then be converted into a networked audio stream 356 to send to the VR Simulation. This would allow the VR simulation 806 to playback audio within the VR simulation at the location of the virtual mobile device visualization 388.

Mobile app plugin 1002 may send configuration data 354 to the VR simulation 806 (through FIG. 10C—372). For example, the remote app can identify which phone form factor or specifications it is running on and transmit that configuration data back to the VR simulation 806 so that the virtual mobile device visualization 388 can choose the appropriate mesh and screen dimensions/resolution to display within the VR Simulation.

FIG. 10C illustrates a VR simulation, according to some embodiments. In this embodiment, a VR simulation 806 is running on a VR PC with a VR Headset (108) or on a stand-alone VR device 364. A virtual environment simulation 368 is created by the developer to mirror a location/environment for where their mobile app being developed can be deployed. For example, if the user is creating a mobile game that can be played in a music venue, then they would create a VR Virtual Environment with 3D assets for that venue so they can test their mobile device within the context of that venue. In this example embodiment, a rendered virtual mobile device visualization is generated in a VR simulation.

The virtual environment consists of 3D programmatically controlled assets rendered within a game engine or similar 3D platform that allows an output to a Virtual Reality (VR) headset 108. This virtual environment would be a recreation of real-world environments/location-based entertainment (LBE) venues/indoor or outdoor installations within a Virtual Reality (VR). By combining physical and simulated data from a physical and virtual mobile device and rendering that within a VR simulation, the system provides the developer a more hands-on accurate representation and feel for how their mobile app can work at a real-world environment.

Inside of the VR simulation, the system embeds a VR plugin 1004, which can be a set of libraries or modules (i.e. code package, statically linked library, dynamically linked library, etc.) that provides a convenient way for the developer of the VR simulation to render the virtual mobile device visualization 388 within the virtual environment 368 and allows the virtual mobile device to interface with the physical mobile device 802, tracking of the physical mobile device case 103, and mobile device mobile app through networked communications.

The virtual mobile device visualization 388 has a primary function of visualizing the video and audio stream from the mobile app that represents the physical mobile device output. In addition, it provides a tangible, to-scale and properly positioned/oriented visualization of the phone tracker case 103 held in hand.

The virtual mobile device visualization 388 is a textured 3D mesh that is paired up with its corresponding physical mobile device case 103. Each mobile device case can have a representative virtual mobile device that works with the mobile device case, but, in an alternate embodiment, the user can have the option of "simulating" another virtual mobile device with a non-corresponding physical mobile device case (i.e., using an iOS Physical Mobile Device, but wanting to "simulate" an Android virtual mobile device)

Mobile device form factors can be stored in the VR plugin 1004 along with a look-up table that contains valuable information for that device form factor. For example, it would store the resolution of the device, aspect ratio of the device, screen bounding rectangle coordinates relative to the physical mobile device case tracking location, and feature availability. This data can be used to properly configure the virtual mobile device visualization 388 to properly match the video resolution and other features of the physical mobile device 802.

The VR plugin 1004 may receive and send configuration data 372 via the network, and this can allow the VR plugin to configure the appropriate properties (e.g., resolution of the incoming video stream from the mobile simulation, real time update synchronization, and touch position recognition) for ensuring that the mobile app can be rendered/represented to visual and performative scale within the virtual mobile device. This also allows the VR simulation to communicate back to the mobile app to send configuration data that the VR user sets within the VR simulation.

With some lower resolution VR headsets, when a user holds the virtual mobile device too close to their head mounted display (HMD) eyes, the screen of the mobile phone becomes slightly degraded in quality. Scaling the phone scale from 1:1 (proper world scale) to 2:1 or another ratio, gives additional clarity by enlarging the virtual mobile device visualization. This allows the user to still control a physical mobile device, but the VR simulation enlarges it as needed.

The VR plugin 1004 can make use of information from the outside-in 202 or inside-out tracking 206 of the physical mobile device case 103. With this tracking information, the VR plugin 1004 calculates the mobile device case position and orientation 376 relative to the VR HMD and the virtual environment and sets the position and orientation of the virtual mobile device 3D mesh 382 inside of the virtual environment. This allows the user to move the physical mobile device and see the corresponding virtual mobile device visualization 388 move inside of the VR simulation 806.

The VR plugin 1004 may also listen for video/audio streams 374 on the network. It can take the audio stream and stream it into a 3D audio source that is parented to the virtual mobile device position and orientation. The game engine or platform that is running the VR simulation can mix and render that audio (map 380) in 3D within the VR environment. It can also take the video stream and, depending on the virtual mobile device configuration, can enable an AR simulation mode (378). If the AR simulation mode is not enabled, then it can map the video stream texture onto the 3D Mesh 386. If the AR simulation mode is enabled, it can merge the video stream with the virtual camera 384 that is attached to the virtual mobile device.

The VR plugin 1004 attaches a virtual camera and virtual microphone 390 to the virtual mobile device visualization, at the location/coordinates of where the camera and microphone would exist on the physical device, provide by the configuration look-up table for that device, and uses this virtual camera and microphone to capture video and/or audio of the virtual scene from the position of the virtual mobile device. The video is captured as frames taken from the virtual camera into a render target. This render target/graphics buffer can then be merged with the video stream from the mobile app to provide a simulated mobile AR experience within the VR simulation. More information on this in the section below. This video and audio can also be converted back into a network data stream and sent back to the mobile app.

The VR plugin can also simulate the virtual position and orientation 394 of the virtual mobile device relative to the virtual environment which can either be sent back 396 to the network for the mobile app (344/350) to use, or can be converted to simulated sensor data 392. For example, by taking the position and orientation of the virtual mobile device within the VR simulation, the system can convert that to GPS coordinates that can be sent back to the network for the mobile app to make use of as simulated sensor data. Other types of sensor data can also be simulated and sent back, such as simulated GPS coordinates relative to a virtual origin, simulated accelerometer events, simulated gyroscope events, simulated LIDAR sensor data points from the environment, simulated Augmented Reality (AR) anchor, plane, and feature points relative to the virtual environment, and simulated ambient light readings.

The VR simulation can also share simulated sensor data such as anchor, plane, and feature points with the mobile app so that the mobile app can overlay objects, through the use of the alpha/AR overlay, within the VR environment. This leads to an effect that makes it feel like the user is using a real mobile device with AR capabilities within the VR environment.

Figure 11:
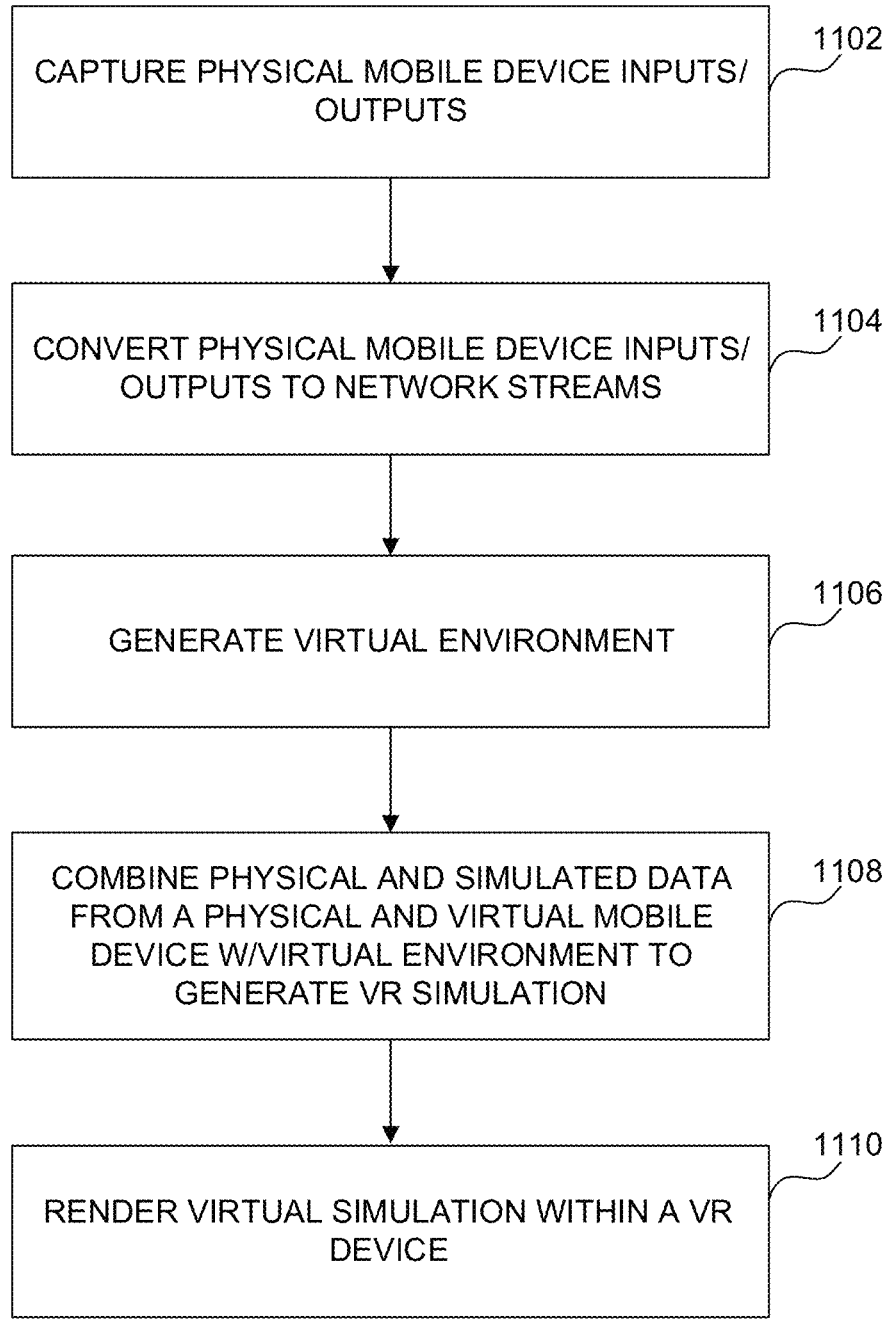
FIG. 11 illustrates a flowchart for a virtual mobile device visualization within a virtual reality (VR) simulation, according to some embodiments.

FIG. 11 illustrates a flow diagram for a virtual mobile device visualization within a virtual reality (VR) simulation, according to an embodiment.

In 1102, a physical mobile device monitors and captures data and inputs/outputs. A physical mobile device mobile application is configured to detect/transmit/receive device data to a VR simulation. For example, mobile app plugin 1002 is configured to listen and control various physical mobile device data points (e.g., audio, video, camera, sensor inputs/outputs, and device configuration).

In 1104, the mobile app plugin converts these physical mobile device data points to network streams (e.g., rendered video, audio, and configuration) and transmits them to the VR simulation.

In 1106, a virtual environment simulation (e.g., real-world location imagery simulation) is generated. In some embodiments, a virtual environment simulation virtually recreates context and physical real-world environments/LBE venue/outdoor or indoor installations where the mobile app can be used. For example, imagery from the real-world environment may be collected by video, pictures, LIDAR scans, pre-recorded imagery, sculpted 3D virtual environments, etc. This imagery is then used to generate a virtual environment simulation of the real-world environment that can then be rendered on a stand-alone computer or on a virtual reality (VR) headset. In some embodiments, the virtual environment has been previously generated (e.g., by a venue) and therefore, virtual environment simulation requires only rendering at this step.

In 1108, the virtual environment simulation is combined with the physical and simulated data from the physical mobile device 102 and virtual mobile device visualization 388 to form a VR simulation.

In 1110, the VR simulation is rendered (drawn) within a VR device (e.g., VR headset 108 or VR PC).

FIG. 12 illustrates a system 1200 for a virtual mobile device visualization within a virtual reality (VR) simulation, according to some embodiments. Physical mobile device 1302 may include a downloaded mobile app 1300 executed on computer processor 1304 with corresponding process flows as described in greater detail in FIG. 13B. A VR PC or Standalone VR device 1301 provides a VR simulation 1306 to test the mobile application as detailed hereafter in association with FIG. 13C.

A mobile device case 103 (FIG. 1) attaches to the physical mobile device 1302 in the real-world to allow for precise outside-in tracking 202 or inside-out tracking 206 of its physical location coordinates and screen boundary coordinates relative to a virtual origin within a VR simulation, transmitting and combining simulated and physical input, camera, microphone, sensor, display, and audio data between a VR simulation and a mobile app running on a physical mobile device.

A VR simulation that virtually recreates the context and physical real-world environments/LBE venues/outdoor or indoor installations where the mobile app can be used, includes a virtual mobile device visualization within the VR simulation which combines the physical and simulated input, camera, microphone, sensor, display, and audio data from the VR simulation, the mobile app running on a physical mobile device.

This example embodiment is similar to FIGS. 6A-6C, but instead of using a mobile app development PC with mobile app simulation, mobile app development is implemented directly on the physical mobile device in combination with a VR simulation. This architecture allows a developer to provide mobile app builds that QA (Quality Assurance) or stakeholders can test without needing to travel to the real-world environment.

In this embodiment, a mobile app 1300 includes a mobile app plugin 1308 on the physical mobile device 1302. This allows for similar functionality as FIGS. 6A-6C, but in this embodiment, the mobile app plugin 1308 interfaces directly with the physical mobile device 1302.

In this embodiment, instead of rendering frames from the mobile app and mapping that onto the virtual mobile device visualization directly, it converts the rendered frames to a networked video stream and communicates it the physical mobile device 602 display/screen. Then the virtual mobile device visualization uses a cropped video pass-through capture, using the VR headset's cameras, to overlay or mask the cropped video of the physical mobile device onto the virtual mobile device visualization. For example, this is like poking a window from VR into the real-world so you can see the physical mobile device and your fingers while playing it.

In various embodiments, Outside-In tracking 202 and Inside-Out tracking 206 methods are configured to track a physical mobile device 1302 screen bounding rectangle for captured video within VR headset 108.

Outside-In tracking 202 makes use of external cameras located near (e.g., same room) the VR headset 108. The external cameras implement tracking of a physical mobile device case 103 relative to the position of the VR headset 108. In some embodiments, the tracking case 103 is securely attached to the physical mobile device and includes various tracking elements, such as GPS, gyroscopes, accelerometers, magnetometers, structured light systems, identifiable markings around a perimeter of the case, etc.

In one embodiment, it is also possible to visualize a user's hands within VR by making use of a 3D model of hands or finger tracking to track where on the screen they are touching and moving to match touch poses. These hand/finger tracking methods can also be used with both Outside-In and Inside-Out tracking.

In one embodiment, screen boundary coordinates are tracked with Outside-In tracking 202. Since a location of the tracker relative to the physical edges of the mobile device case 103 is known, a pre-determined measured look-up table of relative distances from the edges of each physical mobile device case (e.g., known dimensions of cases to smartphone dimensions including screen size) with respect to the location and orientation of the tracker is created. This provides a calculated location of the mobile device case's bounding rectangle that can be used within the VR Simulation.

Inside-Out tracking 206 makes use of onboard cameras on a VR headset to track objects using machine vision techniques, without the use of external base stations or external cameras. VR headsets support inside-out tracking for the headset position. These headsets track active lights on VR controllers and use machine vision techniques to track the motion of the lights/markers, then since they know the exact position of those markers, they can calculate the orientation and position of the VR controllers. This similar technique can be used for inside-out tracking 206 of a custom-built mobile device case.

In one embodiment, active tracking cases, may include lights (visible or infrared) that surround the mobile device case powered by the physical mobile device 1302 or batteries. The lights can have various positions around the mobile device case 103. These lights allow the VR Headset to track the position of the mobile phone in space by triangulating between three or more known light positions on the case and by knowing the dimensions of the mobile device case 103. With this information, an approximate 3D location of the phone in space relative to the VR headset 108 camera position is calculated.

Figure 13A:
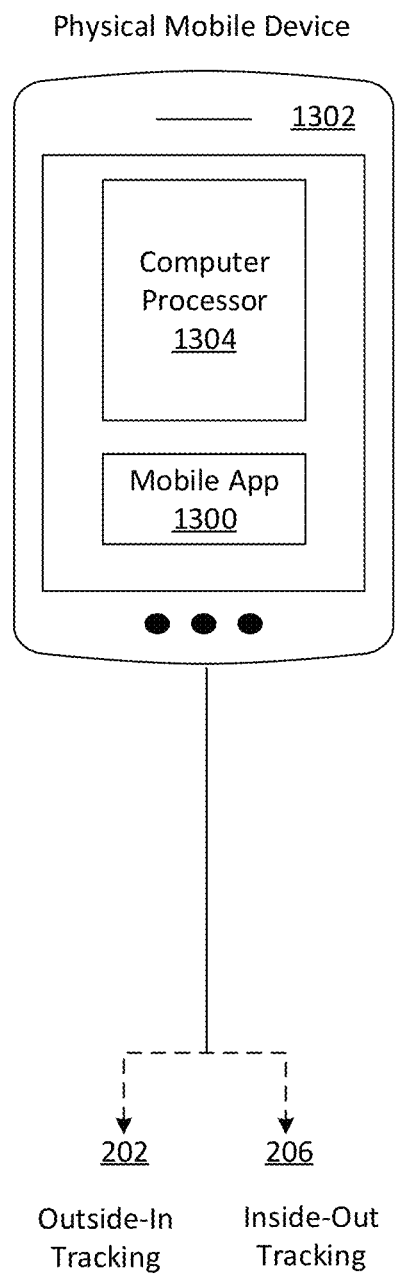
FIG. 13A illustrates a physical mobile device with mobile device case, according to some embodiments.
Figure 13B:
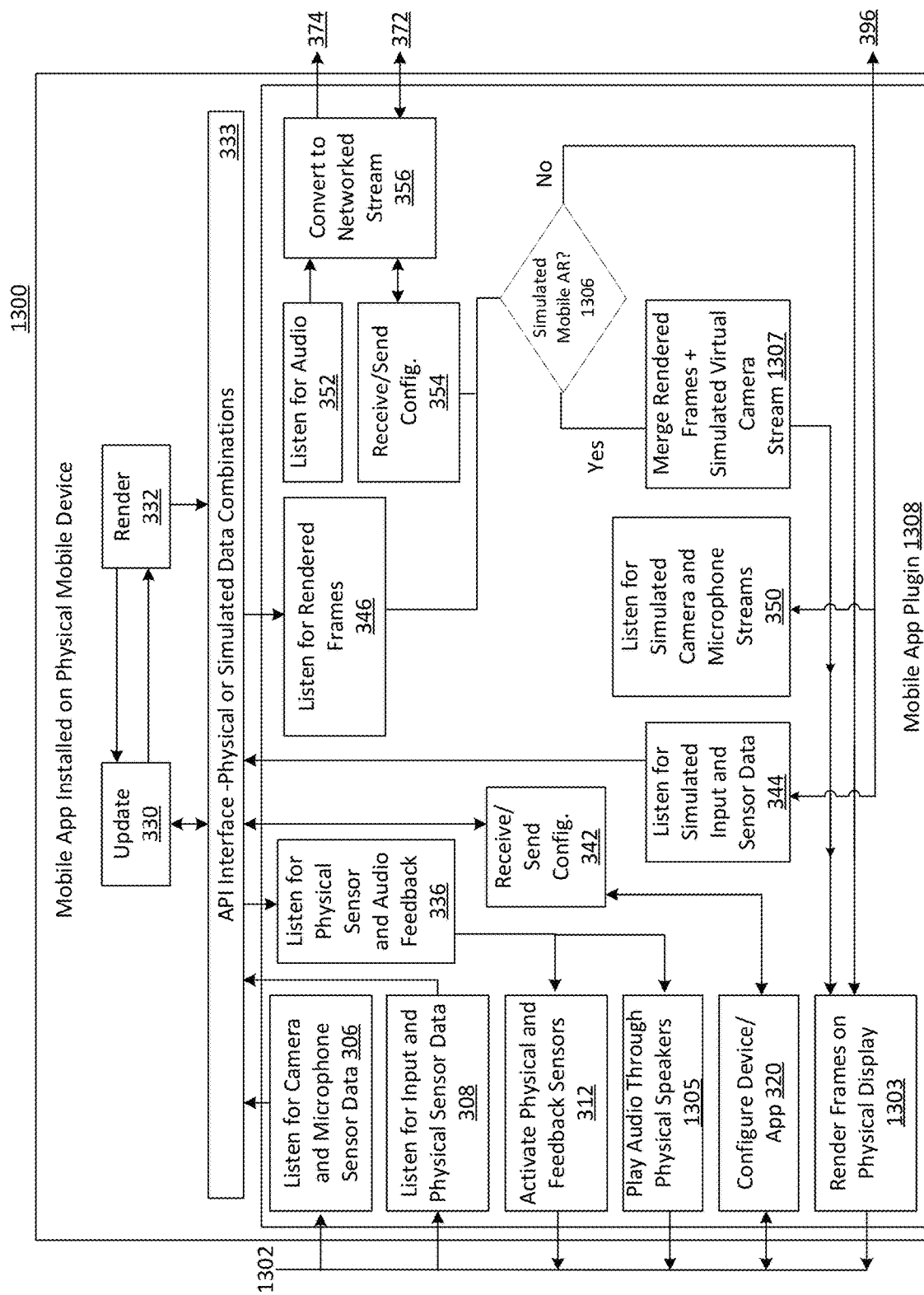
FIG. 13B illustrates an installed mobile app processing flow, according to some embodiments.

FIG. 13A illustrates a physical mobile device with mobile device case, according to some embodiments. Physical mobile device 1302 has a mobile app 1300 installed as a mobile app plugin 1308 (FIG. 13B). This mobile app plugin is configured to listen and control various physical mobile device data points as will be discussed in greater detail in association with FIG. 13B.

Physical mobile device 1302 is, for example, a smartphone. The physical mobile device gets inserted (secure attachment) into a custom tracking case 103 that is configured to track the mobile device's position relative to a location of the custom tracking case within the VR simulation (e.g., headset 108).

The mobile device case attached to the physical mobile device (1304) in the real world communicates with outside-in tracking 202 or inside-out tracking 206 of its physical location coordinates and screen boundary coordinates relative to a virtual origin within a VR simulation.

FIG. 13B illustrates a mobile app processing flow, according to some embodiments. Inputs, camera, microphone, sensor data, and configurations are converted into a networked data stream to transmit and receive between the mobile app plugin and VR simulation, and other parts of system 1200.

In one embodiment, networked data streams between the mobile app plugin 1308 and the VR app plugin 1318 (FIG. 13C) may be implemented using a networking library that makes use of an underlying network transport protocol, such as UDP or TCP, and using a known application protocols (networking protocols) for custom data transfer and using known streaming networking protocols for video/audio streaming. These known application protocols typically contain libraries allowing a variety of data types to encode and decode the data at each device or computer and make use of the data or corresponding video/audio streams.

This networked communication can happen locally, such as peer-to-peer between devices or through a centralized server that can communicate with all the devices on the system either wired (i.e., using Ethernet or Universal Serial Bus (USB)) or wirelessly (i.e., using WiFi, Bluetooth or mobile communications standards). In one embodiment, networked data streams between the remote app, mobile app simulation, and VR simulation may be implemented using a networking library that makes use of an underlying network transport protocol, such as UDP or TCP, and using a known application protocols (networking protocols) for custom data transfer and using known streaming networking protocols for video/audio streaming. These known application protocols typically contain libraries allowing a variety of data types to encode and decode the data at each device or computer and make use of the data or corresponding video/audio streams.

The mobile app 1300 is the custom mobile application that the developer is creating, testing, debugging, etc. This mobile app can eventually be developed into a deployable mobile app that can be downloaded onto a mobile device for testing onsite, but with the technology tools described herein, the system may test the mobile app on the physical mobile device hardware in combination with the virtual simulation and VR headset 108.

The mobile app 1300 has a standard update/render loop. The update process 330 updates the mobile app state by taking in input data from various sources, programmatically changing the application state, and programmatically communicating and updating external data sinks. In the above example, the mobile app communicates with the API interface 333 of mobile app plugin 1308. The mobile app plugin 1308 communicates directly with the mobile app 1300 through its update/render loop to provide data and receive data for modifying the application state and receives the rendered graphics and audio content.

After the update process 330 has updated the state of the application, the render process 332 can take the application state and draw/update 2D and 3D graphics buffers and update audio buffers to prepare for displaying on-screen and outputting to the audio system. In various embodiments, there can be more than one update and render process and some may run in parallel in different mobile app systems. For example, other platforms can be interchangeably be used to create mobile apps as per the technology described herein. Mobile app plugin 1308, which can be a set of libraries or modules (i.e., code package, statically linked library, dynamically linked library, etc.) provides a convenient way for the developer of the mobile app to interface with the physical mobile device 1302 and VR simulation 1306 through networked communication.

Mobile app plugin 1308 may listen for camera and microphone sensor data 306 and physical inputs and sensor data 308. For example, the mobile app plugin 1308 may turn on/off lights or camera flash/flashlight, etc.

Mobile app plugin 1308 may activate/control the physical mobile device's feedback sensors 312. Sensor activation may include, but is not limited to, physical and feedback sensors such as haptics and vibrations based on listening for sensor and audio feedback data 336. Some examples of input data are touch and drag events, touch gesture events (i.e., swipe left/up/down/right, double taps, other swipes and gesture patterns, etc.), and motion gesture events (i.e., shake the mobile device, shake left, shake right, orient the device in portrait or landscape, etc.). Some examples of sensor data are GPS events, accelerometer events, gyroscope events, LIDAR sensor data (front and back LIDAR cameras for scanning, face tracking, AR, etc.), Camera/LIDAR AR anchor, plane, feature points, and ambient light sensors. This is useful for the mobile app to make use of all the physical mobile device feedback mechanisms for a user that is holding the physical mobile device to feel.

Mobile app plugin 1308 may activate audio streams 1305. For example, audio can be played through the physical speakers based on listening for an audio stream.

Mobile app plugin 1308 may turn on/off the mobile device camera, microphone, input, sensors, and feedback sensors based on a configuration 320. In this way, the mobile app plugin 1308 can enable/disable features by configuring 320 the device/app needed for the current mobile app being developed. For example, the mobile app plugin 1308 may use camera (front and back cameras) video and microphone audio sensor data. Mobile app plugin 1308 can send and receive configuration changes (342 or 354) through the API Interface as networked data streams 340 or 356.

Figure 13C:
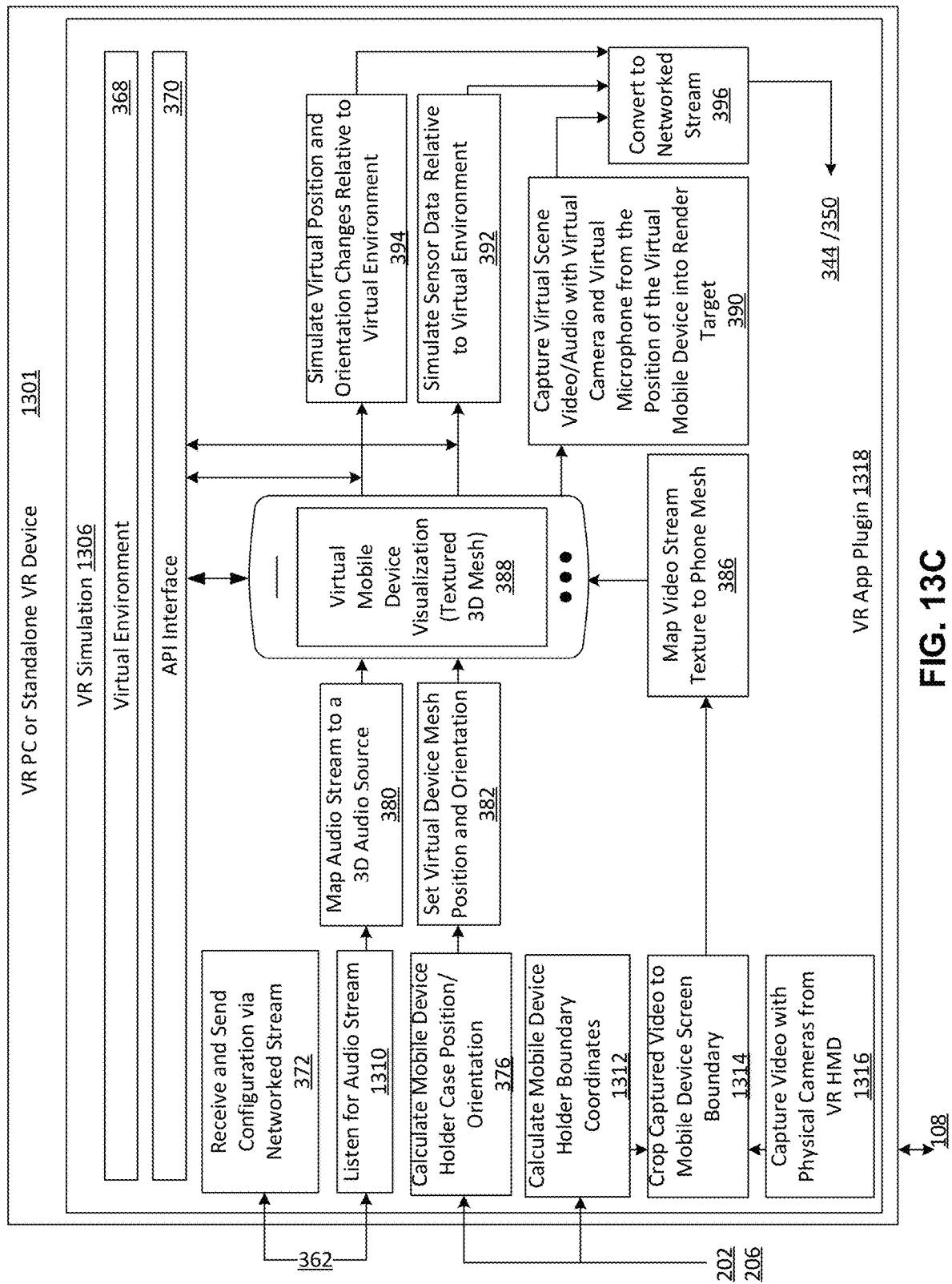
FIG. 13C illustrates a VR simulation with video pass-through virtual mobile device visualization, according to some embodiments.

Mobile app plugin 1308 may listen for simulated input and sensor data streams 344 from the VR simulation 1306 via networked data (FIG. 13C—396). This simulated input and sensor data is then made available to the mobile app via the API Interface for the developer. For example, this would allow a user to receive GPS coordinates from the VR simulation to allow the mobile app to respond to geographic changes in the simulated VR environment 368 that the virtual mobile device 1388 is being developed in.

Mobile app plugin 1308 may listen for simulated camera and microphone video/audio streams 350 from the VR simulation 1306 via networked data (FIG. 13C—396). This simulated video/audio data is then made available to the mobile app via the API interface 333 for the developer. For example, this would allow a user to receive a simulated video stream of what the virtual mobile device within the VR simulation is capturing, and a developer could use the video frames to apply mobile AR overlays on the data.

Mobile app plugin 1308 may listen for rendered graphics frames 346 from the mobile app through the API interface. The VR plugin 1308 (FIG. 13C) may take the video stream and, depending on the virtual mobile device configuration, can enable an AR simulation mode (1306). If the AR simulation mode is not enabled, then it can render frames 1303 on a physical display of physical mobile device 1302. If the AR simulation mode 1306 is enabled, it will merge the video stream with a simulated virtual camera 1307 and then it can render frames 1304 on a physical display of physical mobile device 1302.

Mobile app plugin 1308 may listen for audio streams 352 from the mobile app through the API interface. These audio streams can then be converted into a networked audio stream 356 to send to the VR Simulation. This would allow the VR simulation 1306 to playback audio within the VR simulation at the location of the virtual mobile device visualization 388.

Mobile app plugin 1308 may send configuration data 354 to the VR simulation 1306 (through FIG. 13C—372). For example, the remote app can identify which phone form factor or specifications it is running on and transmit that configuration data back to the VR simulation 1306 so that the virtual mobile device visualization 388 can choose the appropriate mesh and screen dimensions/resolution to display within the VR Simulation.

FIG. 13C illustrates a VR Simulation, according to some embodiments. In this embodiment, a VR simulation 1306 is running on a VR PC with a VR Headset (108) or on a stand-alone VR device 1301. This VR simulation is created by the developer to mirror a location/environment for where their mobile app being developed can be deployed. For example, if the user is creating a mobile game that can be played in a music venue, then they would create a VR virtual environment with 3D assets for that venue so they can test their mobile device within the context of that venue.

The virtual environment consists of 3D programmatically controlled assets rendered within a game engine or similar 3D platform that allows an output to a Virtual Reality (VR) headset 108. This virtual environment would be a recreation of real-world environments/location-based entertainment (LBE) venues/indoor or outdoor installations within a Virtual Reality (VR). By combining physical and simulated data from a physical and virtual mobile device and rendering that within a VR simulation, the system provides the developer a more hands-on accurate representation and feel for how their mobile app can work at a real-world environment.

Inside of the VR simulation, the system embeds a VR plugin 1318, which can be a set of libraries or modules (i.e. code package, statically linked library, dynamically linked library, etc.) that provides a convenient way for the developer of the VR simulation to render the virtual mobile device visualization 388 within the virtual environment 368 and allows the virtual mobile device to interface with the physical mobile device 1302, tracking of the physical mobile device case 103, and mobile app 1300 through networked communications.

The virtual mobile device visualization 388 has a primary function of visualizing the video and audio stream from the mobile app that represents the physical mobile device output. In addition, it provides a tangible, to-scale and properly positioned/oriented visualization of the phone tracker case 103 held in hand.

The virtual mobile device visualization 388 is a textured 3D mesh that is paired up with its corresponding physical mobile device case 103. Each mobile device case can have a representative virtual mobile device that works with the mobile device case, but, in an alternate embodiment, the user can have the option of "simulating" another virtual mobile device with a non-corresponding physical mobile device case (i.e., using an iOS Physical Mobile Device, but wanting to "simulate" an Android virtual mobile device). In addition, the scale and other features of the virtual mobile device may be adjusted as well to a user's liking.

Mobile device form factors can be stored in the VR plugin 1318 along with a look-up table that contains valuable information for that device form factor. For example, it would store the resolution of the device, aspect ratio of the device, screen bounding rectangle coordinates relative to the physical mobile device case tracking location, and feature availability. This data can be used to properly configure the virtual mobile device visualization 388 to properly match the video resolution and other features of the physical mobile device 102.

The VR plugin 1318 may receive and send configuration data 372 via the network, and this can allow the VR plugin to configure the (e.g., resolution of the incoming video stream from the mobile simulation, real time update synchronization, and touch position recognition, etc.) for ensuring that the mobile app or mobile app simulation can be rendered/represented to visual and performative scale within the virtual mobile device. This also allows the VR simulation to communicate back to the mobile app/mobile app simulation and remote app to send configuration data that the VR user sets within the VR simulation.

With some lower resolution VR headsets, when a user holds the virtual mobile device too close to their head mounted display (HMD) eyes, the screen of the mobile phone becomes slightly degraded in quality. Scaling the phone scale from 1:1 (proper world scale) to 2:1 or another ratio, gives additional clarity by enlarging the virtual mobile device visualization. This allows the user to still control a physical mobile device, but the VR simulation enlarges it as needed.

The VR plugin 1318 can make use of information from the outside-in 202 or inside-out tracking 206 of the physical mobile device case 103. With this tracking information, the VR plugin 1318 calculates the mobile device case position and orientation 376 relative to the VR HMD and the virtual environment and sets the position and orientation of the virtual mobile device 3D mesh 382 inside of the virtual environment. This allows the user to move the physical mobile device and see the corresponding virtual mobile device visualization 388 move inside of the VR simulation 1306.

The VR plugin 1318 may also listen for audio streams 1310 on the network. It can take the audio stream and stream it into a 3D audio source that is parented to the virtual mobile device position and orientation. The game engine or platform that is running the VR simulation can mix and render that audio (map 380) in 3D within the VR environment.

The VR plugin 1318 may calculate mobile device holder 103 boundary coordinates 1312, capture video from physical cameras 1316 from VR headset 108, and crop the captured video to mobile device screen boundary 1314, and map the video stream texture onto the 3D mesh 386. In addition, the system uses the tracked mobile device case screen boundary coordinates to provide a video pass-through visualization of the physical mobile device screen by cropping a video feed from the VR headset based on calculated screen boundary coordinates.

The VR plugin 1318 attaches a virtual camera and virtual microphone 390 to the virtual mobile device visualization, at the location/coordinates of where the camera and microphone would exist on the physical device, provide by the configuration look-up table for that device, and uses this virtual camera and microphone to capture video and/or audio of the virtual scene from the position of the virtual mobile device. The video is captured as frames taken from the virtual camera into a render target. This render target/graphics buffer can then be merged with the video stream from the mobile app simulation to provide a simulated mobile AR experience within the VR simulation. This video and audio can also be converted back into a network data stream and sent back to the mobile app simulation.

The VR Plugin can also simulate the virtual position and orientation 394 of the virtual mobile device relative to the virtual environment which can either be sent back 396 to the network for the mobile app (344/350) to use, or can be converted to simulated sensor data 392. For example, by taking the position and orientation of the virtual mobile device within the VR simulation, the system can convert that to GPS coordinates that can be sent back to the network for the mobile app to make use of as simulated sensor data. Other types of sensor data can also be simulated and sent back, such as simulated GPS coordinates relative to a virtual origin, simulated accelerometer events, simulated gyroscope events, simulated LIDAR sensor data points from the environment, simulated Augmented Reality anchor, plane, and feature points relative to the virtual environment, and simulated ambient light readings.

The VR simulation can also share simulated sensor data such as anchor, plane, and feature points with the mobile app simulation so that the mobile app simulation can overlay objects, through the use of the alpha/AR overlay, within the VR environment. This leads to an effect that makes it feel like the user is using a real mobile device with AR capabilities within the VR environment.

Figure 14:
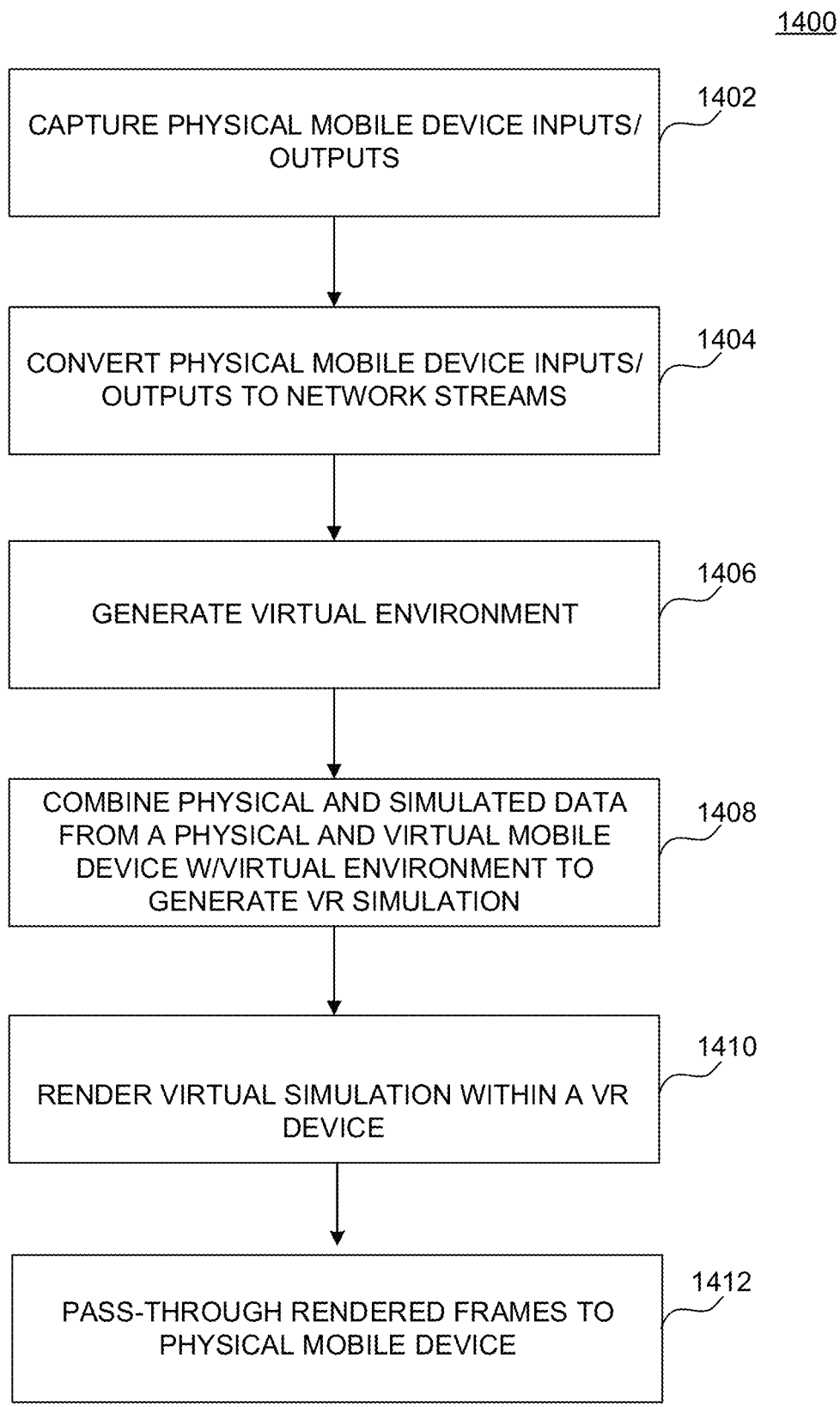
FIG. 14 illustrates a flowchart for a virtual mobile device visualization within a virtual reality (VR) simulation, according to some embodiments.

FIG. 14 illustrates a flow diagram for a virtual mobile device visualization within a virtual reality (VR) simulation, according to an embodiment.

In 1402, a physical mobile device monitors and captures inputs/outputs. A physical mobile device mobile application is configured to detect/transmit/receive device data to a VR simulation. For example, mobile app plugin 1308 is configured to listen and control various physical mobile device data points (e.g., audio, video, camera, sensor inputs/outputs, and device configuration).

In 1404, the mobile app plugin converts these physical mobile device data points to network streams (e.g., rendered video, audio, and configuration) and transmits them to the VR simulation.

In 1406, a virtual environment simulation (e.g., real-world location imagery simulation) is generated. In some embodiments, a virtual environment simulation virtually recreates context and physical real-world environments/LBE venue/outdoor or indoor installations where the mobile app can be used. For example, imagery from the real-world environment may be collected by video, pictures, LIDAR scans, pre-recorded imagery, sculpted 3D virtual environments, etc. This imagery is then used to generate a virtual environment simulation of the real-world environment that can then be rendered on a stand-alone computer or on a virtual reality (VR) headset. In some embodiments, the virtual environment has been previously generated (e.g., by a venue) and therefore, virtual environment simulation requires only rendering at this step.

In 1408, the virtual environment simulation is combined with the physical and simulated data from the physical mobile device 602 and virtual mobile device visualization 388 to form a VR simulation 366.

In 1410, the VR simulation is rendered (drawn) within a VR device (e.g., VR headset 108 or VR PC).

In 1412, video in the VR device representing the screen (display) on the mobile device is passed-through to the physical mobile device for display thereon. For example, the system uses tracked mobile device case screen boundary coordinates to provide a video pass-through visualization of the physical mobile device screen by cropping a video feed from the VR headset based on calculated screen boundary coordinates.

Figure 15:
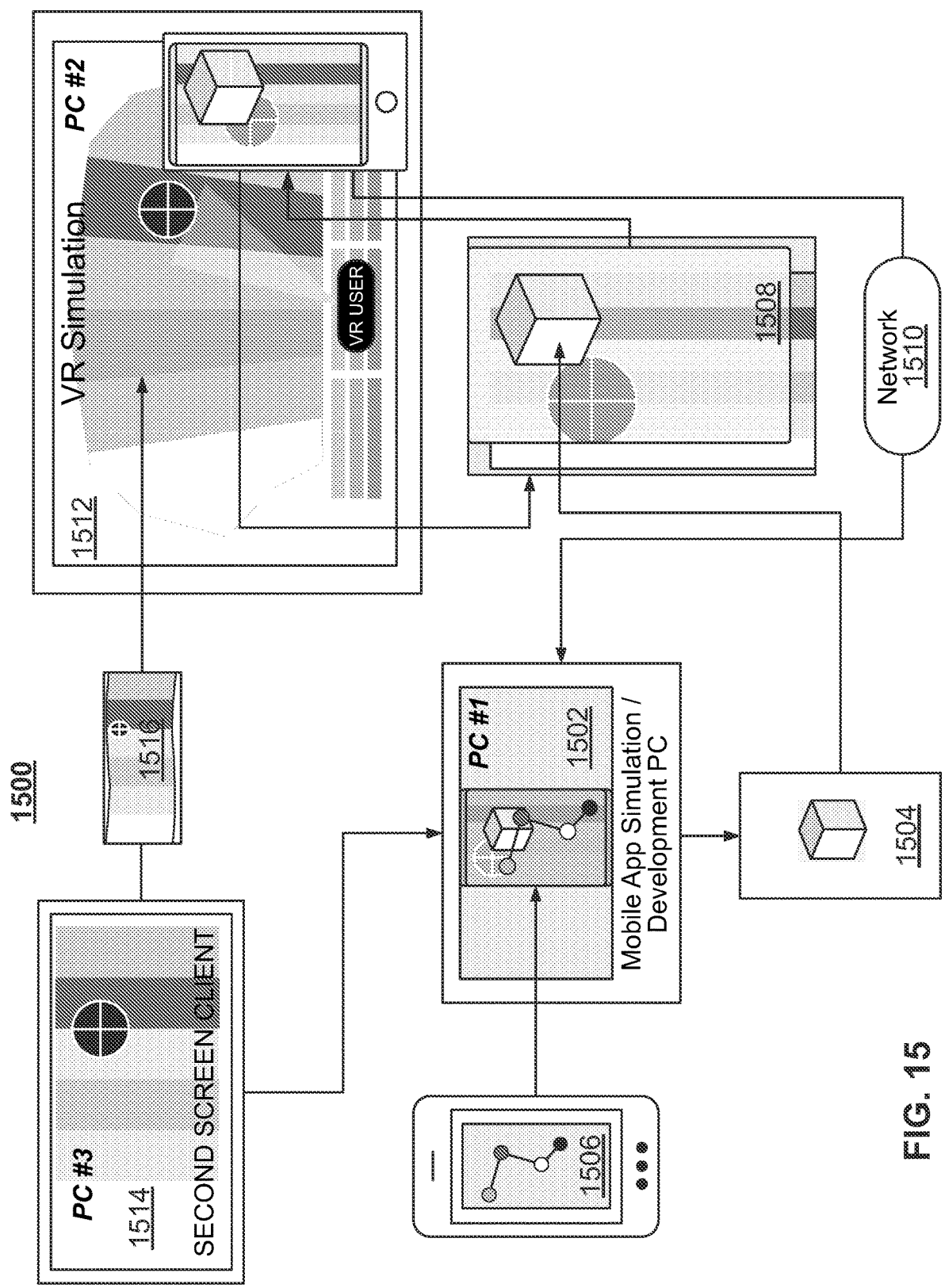
FIG. 15 illustrates an example embodiment implementing a mobile app simulation rendering of a cube as an alpha/AR overlay.

FIG. 15 illustrates an example embodiment 1500 implementing a mobile app simulation rendering a cube 1504 as an alpha/AR overlay 1508 that gets combined with a virtual mobile device camera capture 1506. The virtual mobile device camera is capturing a virtual scene from a position of the virtual mobile device, and the VR plugin or mobile app plugin combine the alpha/AR overlay with the capture of the virtual scene. In operation, the VR simulation sends the position and orientation of the virtual mobile device to the mobile app simulation 1502 so that the mobile app knows where it is relative to the virtual environment 1512. With this information, the system can properly render the viewpoint of the cube 1504 in the example for the alpha/AR overlay. This figure shows a VR simulation example of various AR sensor data capabilities by the simulated mobile AR system.

Network 1510 may include one or more wired and/or wireless networks. For example, the network 1510 may include a cellular network (e.g., a long-term evolution (LTE) network, a code division multiple access (CDMA) network, a 3G network, a 4G network, a 5G network, another type of next generation network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, and/or the like, and/or a combination of these or other types of networks.

This also illustrates a VR simulation with optional second screen video sources 1514 streaming 1516 into the VR Environment 1512.

Figure 16:
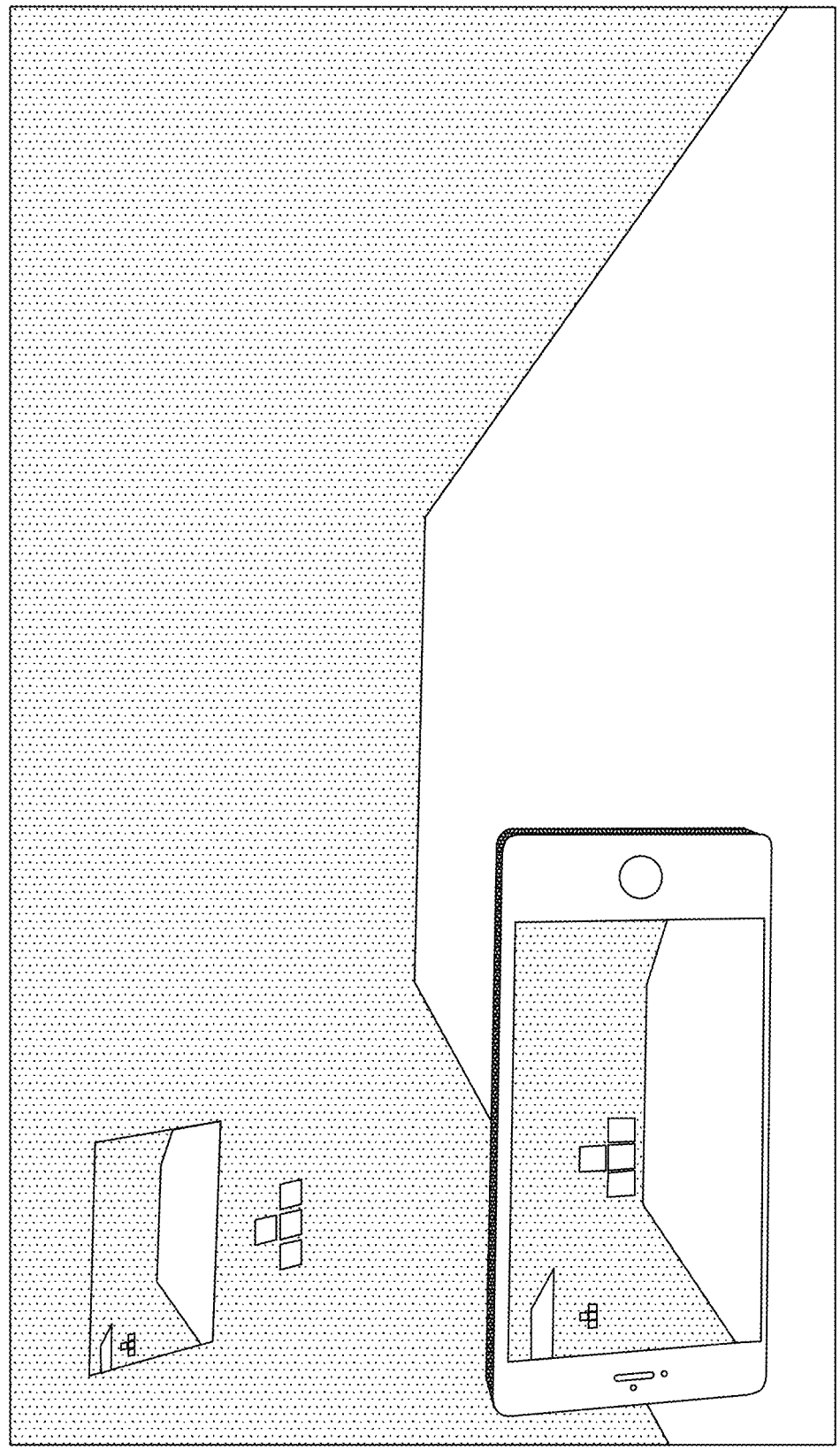
FIG. 16 illustrates an example embodiment implementing a simulated image/feature tracking within a VR simulation.

FIG. 16 illustrates an example of simulated image/feature tracking within a VR simulation, according to some embodiments. On the bottom left, the alpha/AR overlay, and on the top left the VR environment scene. In the middle, the combined VR simulation shows the VR environment and the virtual mobile device visualization showing the combined virtual device camera capture with the alpha/AR overlay. This was achieved by using the simulated mobile AR system and sending simulated sensor data back to the mobile app simulation. The simulated sensor data here is a set of image/feature coordinates relative to the virtual mobile device location so that the mobile app simulation can appropriately render the floating object with the correct perspective and position within the alpha/AR overlay.

The representative functions described herein can be implemented in hardware, software or some combination thereof. For instance, the representative functions can be implemented using computer processors, computer logic, application specific circuits (ASIC), digital signal processors, etc., as will be understood by those skilled in the arts based on the discussion given herein. Accordingly, any processor that performs the functions described herein is within the scope and spirit of the embodiments presented herein.

Figure 17:
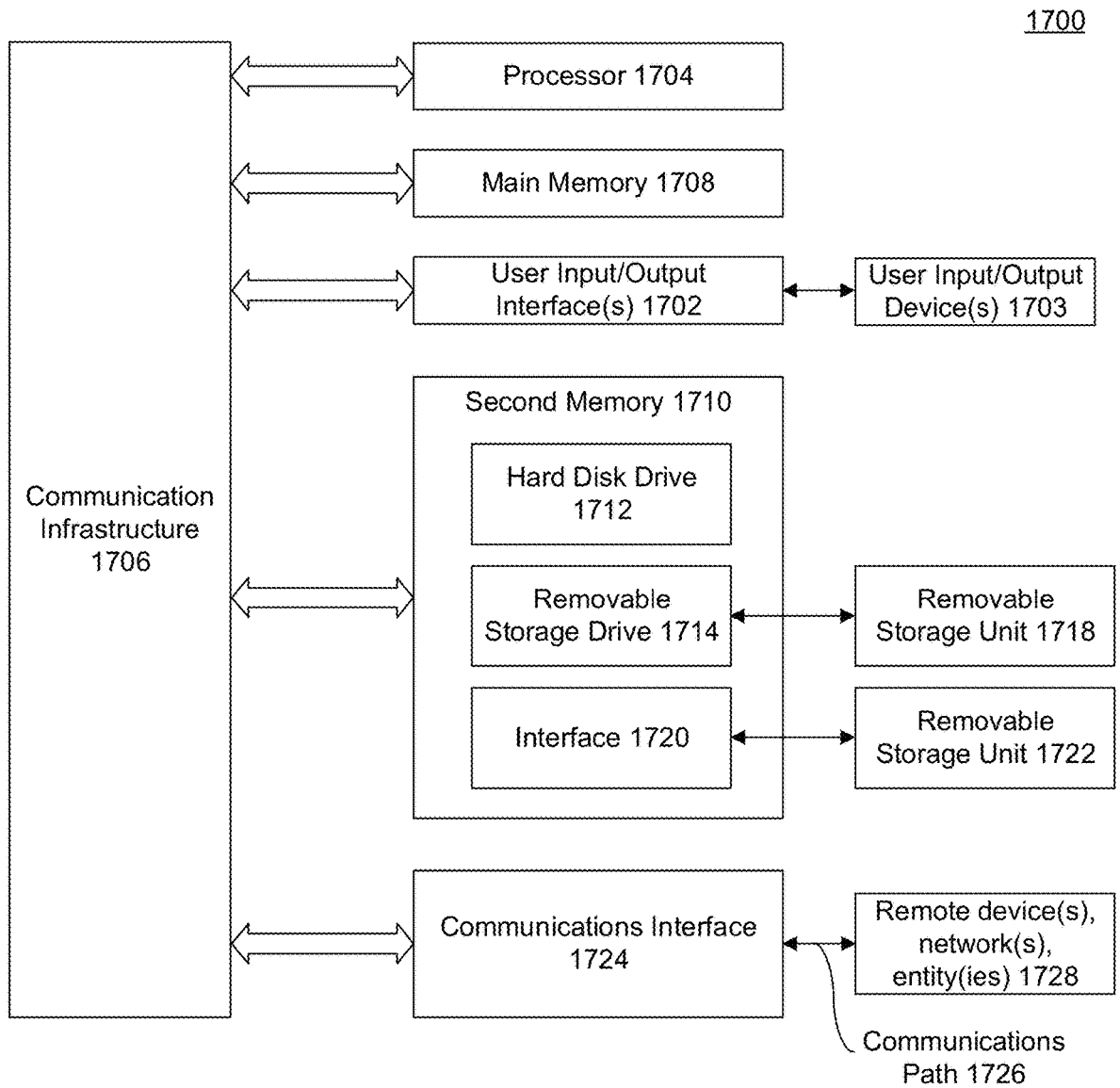
FIG. 17 is a block diagram of an exemplary computer system which can be used to implement the embodiments disclosed herein.

The following describes a general-purpose computer system that can be used to implement embodiments of the disclosure presented herein. The present disclosure can be implemented in hardware, or as a combination of software and hardware. Consequently, the disclosure may be implemented in the environment of a computer system or other processing system. An example of such a computer system 1700 is shown in FIG. 17.

Computer system 1700 includes one or more processors (also called central processing units, or CPUs), such as processor 1704. Processor 1704 can be a special purpose or a general purpose digital signal processor. Processor 1704 is connected to a communication infrastructure 1706 (for example, a bus or network). Various software implementations are described in terms of this exemplary computer system. After reading this description, it will become apparent to a person skilled in the relevant art how to implement the disclosure using other computer systems and/or computer architectures.

Computer system 1700 also includes user input/output device(s) 1703, such as monitors, keyboards, pointing devices, etc., that communicate with communication infrastructure 1706 through user input/output interface(s) 1702.

Computer system 1700 also includes a main memory 1705, preferably random access memory (RAM), and may also include a secondary memory 1710. The secondary memory 1710 may include, for example, a hard disk drive 1712, and/or a RAID array 1716, and/or a removable storage drive 1714, representing a floppy disk drive, a magnetic tape drive, an optical disk drive, etc. The removable storage drive 1714 reads from and/or writes to a removable storage unit 1718 in a well-known manner. Removable storage unit 1718 represents a floppy disk, magnetic tape, optical disk, etc. As will be appreciated, the removable storage unit 1718 includes a computer usable storage medium having stored therein computer software and/or data.

In alternative implementations, secondary memory 1710 may include other similar means for allowing computer programs or other instructions to be loaded into computer system 1700. Such means may include, for example, a removable storage unit 1722 and an interface 1720. Examples of such means may include a program cartridge and cartridge interface (such as that found in video game devices), a removable memory chip (such as an EPROM, or PROM) and associated socket, and other removable storage units 1722 and interfaces 1720 which allow software (i.e.

instructions) and data to be transferred from the removable storage unit 1722 to computer system 1700.

Computer system 1700 may also include a communications interface 1724. Communication interface 1724 enables computer system 1700 to communicate and interact with any combination of remote devices, remote networks, remote entities, etc. (individually and collectively referenced by reference number 1728). Examples of communications interface 1724 may include a modem, a network interface (such as an Ethernet card), a communications port, a PCM-CIA slot and card, etc., that are coupled to a communications path 1726. The communications path 1726 can be implemented using wire or cable, fiber optics, a phone line, a cellular phone link, an RF link and other communications links or channels.

The terms "computer program medium" and "computer usable medium" are used herein to generally refer to media such as removable storage drive 1714, a hard disk installed in hard disk drive 1712, or other hardware type memory. These computer program products are means for providing or storing software (e.g. instructions) to computer system 1700.

Computer programs (also called computer control logic) are stored in main memory 1705 and/or secondary memory 1710. Computer programs may also be received via communications interface 1724. Such computer programs, when executed, enable the computer system 1700 to implement the present disclosure as discussed herein. In particular, the computer programs, when executed, enable the processor 1704 to implement the processes and/or functions of the present disclosure. For example, when executed, the computer programs enable processor 1704 to implement part of or all of the steps described above with reference to the flowcharts herein. Where the disclosure is implemented using software, the software may be stored in a computer program product and loaded into computer system 1700 using raid array 1716, removable storage drive 1714, hard drive 1712 or communications interface 1724.

In other embodiments, features of the disclosure are implemented primarily in hardware using, for example, hardware components such as Application Specific Integrated Circuits (ASICs) and programmable or static gate arrays or other state machine logic. Implementation of a hardware state machine so as to perform the functions described herein will also be apparent to persons skilled in the relevant art(s).

The aforementioned description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any hardware mechanism for storing information in a form readable by a machine (e.g., a computing device). For example, a machine-readable medium may include read only memory (ROM); random access memory (RAM); magnetic disk storage media; optical storage media; flash memory devices; and other hardware implementations. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

In embodiments having one or more components that include one or more processors, one or more of the processors can include (and/or be configured to access) one or more internal and/or external memories that store instructions and/or code that, when executed by the processor(s), cause the processor(s) to perform one or more functions and/or operations related to the operation of the corresponding component(s) as described herein and/or as would appreciated by those skilled in the relevant art(s).

It is to be appreciated that the Detailed Description section, and not the Abstract section, is intended to be used to interpret the claims. The Abstract section may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A system for mobile application testing, comprising:
a virtual reality (VR) simulator device comprising:
a non-transitory computer-readable device having instructions stored thereon; and
at least one computing device executing the instructions and configured by the instructions to:
receive at least captured data inputs and outputs from a remote application resident on a physical mobile device during the mobile application testing, wherein the received data inputs and outputs of the physical mobile device are converted into a network stream by a mobile application plugin configured to listen for and communicate physical, simulated and virtual data points associated with the physical mobile device, wherein the data points include audio, video, camera, or sensor data of the physical mobile device;
simulate a real-world environment;
generate a virtual visualization of the physical mobile device;
capture, based on accessing a configuration look-up table of the physical mobile device, at least one of video or audio of a virtual scene in the simulated real-world environment with at least one of a virtual camera or a virtual microphone from a position of the virtual visualization of the physical mobile device, wherein the virtual camera or the virtual microphone are positioned in the virtual visualization of the physical mobile device at respective locations found on the physical mobile device;
render a VR simulation to recreate a real-world testing environment based at least partially on combining the network stream of the captured data inputs and outputs, the virtual visualization of the physical mobile device, the simulated real-world environment, and the captured video or audio of the virtual scene; and
communicate the VR simulation to a VR headset during the mobile application testing.

2. The system of claim 1, wherein the VR simulator device is further configured to receive a position and orientation of the physical mobile device relative to the VR headset.

3. The system of claim 2, wherein the VR simulator device is further configured to simulate the position and orientation of the physical mobile device relative to the VR headset as a virtual point of origin within the simulated real-world environment.

4. The system of claim 1, wherein the VR simulator device is further configured to receive and send data to a simulation of a mobile application during the mobile application testing.

5. The system of claim 1, wherein the VR simulator device is further configured to receive configuration information of the physical mobile device from a simulation of a mobile application during the mobile application testing.

6. The system of claim 1, wherein the VR simulator device is further configured to send configuration information of the physical mobile device to a simulation of a mobile application during the mobile application testing.

7. The system of claim 1, wherein the VR simulator device is further configured to receive configuration information of the physical mobile device, in the network stream, from the physical mobile device during the mobile application testing.

8. The system of claim 1, wherein the VR simulator device is further configured to send configuration information of the physical mobile device to the simulated mobile device during the mobile application testing.

9. The system of claim 1, wherein the VR simulator device is further configured to:
capture video of physical cameras of the VR headset;
calculate boundary coordinates of a display screen of the physical mobile device;
crop the captured video to be within the boundary coordinates; and
pass-through rendered frames of the cropped captured video to the virtual visualization of the physical mobile device.

10. The system of claim 1, wherein the physical mobile device is any of: a smartphone, a tablet, or a wearable computer.

11. The system of claim 1, wherein the VR simulator device is further configured to configure the virtual visualization of the physical mobile device based on stored form factors of the physical mobile device.

12. The system of claim 1, wherein the VR simulator device is further configured to:
capture video of physical cameras of the VR headset;
track boundary coordinates of a display screen of the physical mobile device;
crop the captured video to be within the boundary coordinates; and
pass-through rendered frames of the cropped captured video to be displayed on the display screen of the physical mobile device.

13. The system of claim 12, wherein the VR simulator device is further configured to pass-through rendered frames of the cropped captured video to the virtual visualization of the physical mobile device.

14. A method for mobile application development, comprising:
capturing, by a mobile application development processing system, data comprising at least inputs and outputs of a physical mobile device received from a remote application resident on the physical mobile device during testing of a mobile application;
converting, by a mobile application plugin configured to listen for and communicate physical, simulated, and virtual data points associated with the physical mobile device, the inputs and outputs of the physical mobile device to a network stream, wherein the data points include audio, video, camera, or sensor data of the physical mobile device;
tracking, by the mobile application development processing system, a position and orientation of the physical mobile device relative to a proximate virtual reality (VR) headset;
simulating, by the mobile application development processing system, a real-world environment;
capturing, based on accessing a configuration look-up table of the physical mobile device, at least one of video or audio of a virtual scene in the simulated real-world environment with at least one of a virtual camera or a virtual microphone from a position of a virtual visualization of the physical mobile device, wherein the virtual camera or the virtual microphone are positioned in the virtual visualization of the physical mobile device at respective locations found on the physical mobile device;

generating, by the mobile application development processing system, a VR simulation to recreate a real-world testing environment based at least partially on combining the network stream of the captured input and outputs, the simulated real-world environment, the captured video or audio of the virtual scene, and the position and orientation of the physical mobile device; and communicating, by the mobile application development processing system, the VR simulation to the VR headset during the testing of the mobile application.

15. The method of claim 14, further comprising simulating the mobile application within the mobile application development processing system.

16. The method of claim 15, further comprising communicating a configuration of the physical mobile device, by the network stream, to the simulated mobile application.

17. The method of claim 14, further comprising:

capturing, by the mobile application development processing system, video of physical cameras of the VR headset;

calculating, by the mobile application development processing system, boundary coordinates of a display screen of the physical mobile device;

cropping, by the mobile application development processing system, the captured video to be within the boundary coordinates; and passing-through, by the mobile application development processing system, rendered frames of the cropped captured video to the virtual visualization of the physical mobile device.

18. A non-transitory computer-readable device having instructions stored thereon that, when executed by at least one computing device, cause the at least one computing device to perform mobile application testing operations, the operations comprising:

capturing data comprising at least inputs and outputs of a physical mobile device during mobile application testing, wherein the inputs and outputs of the physical mobile device are converted into a network stream by a mobile application plugin configured to listen for and communicate physical, simulated, and virtual data points associated with the physical mobile device, wherein the data points include audio, video, camera, or sensor data of the physical mobile device;

tracking a position and orientation of the physical mobile device relative to a proximate virtual reality (VR) headset;

simulating a real-world environment;

capturing, based on accessing a configuration look-up table of the physical mobile device, at least one of video or audio of a virtual scene in the simulated real-world environment with at least one of a virtual camera or a virtual microphone from a position of a virtual visualization of the physical mobile device, wherein the virtual camera or the virtual microphone are positioned in the virtual visualization of the physical mobile device at respective locations found on the physical mobile device; and generating a VR simulation to recreate a real-world testing environment based at least partially on combining the network stream of the captured inputs and outputs, the simulated real-world environment, the captured video or audio of the virtual scene, and the position and orientation of the physical mobile device.

19. The non-transitory computer-readable device of claim 18, the operations further comprising simulating a mobile application within a mobile application development system.

20. The non-transitory computer-readable device of claim 19, the operations further comprising communicating a configuration of the physical mobile device, by the network stream, to the simulation of the mobile application.

21. The non-transitory computer-readable device of claim 18, the operations further comprising:

capturing video of physical cameras of the proximate VR headset;

calculating boundary coordinates of a display screen of the physical mobile device;

cropping the captured video to be within the boundary coordinates; and passing-through rendered frames of the cropped captured video to the physical mobile device.

* * * * *